(12) United States Patent
Yokota

(10) Patent No.: US 7,868,989 B2
(45) Date of Patent: Jan. 11, 2011

(54) MOUNTING STRUCTURE AND ELECTRO OPTICAL DEVICE

(75) Inventor: Tomoki Yokota, Chino (JP)

(73) Assignee: Seiko Epson Corporation, Tokyo (JP)

( * ) Notice: Subject to any disclaimer, the term of this patent is extended or adjusted under 35 U.S.C. 154(b) by 209 days.

(21) Appl. No.: 12/351,192

(22) Filed: Jan. 9, 2009

(65) Prior Publication Data

US 2009/0225268 A1 Sep. 10, 2009

(30) Foreign Application Priority Data

Mar. 10, 2008 (JP) ............................ 2008-059090

(51) Int. Cl.
*G02F 1/1345* (2006.01)
*H01J 11/02* (2006.01)

(52) U.S. Cl. .................. 349/152; 349/150; 349/151; 313/505

(58) Field of Classification Search ............. 349/149, 349/150, 151, 152; 313/500, 505; 257/784, 257/E23.141; 315/169.3; 361/748, 749; 439/65, 67, 77
See application file for complete search history.

(56) References Cited

U.S. PATENT DOCUMENTS

2002/0171797 A1* 11/2002 Ichioka et al. ............. 349/149

FOREIGN PATENT DOCUMENTS

| JP | A-2003-066480 | 3/2003 |
| JP | A-2006-073536 | 3/2006 |

* cited by examiner

*Primary Examiner*—Dung T Nguyen
*Assistant Examiner*—Tai Duong
(74) *Attorney, Agent, or Firm*—Oliff & Berridge, PLC

(57) ABSTRACT

In a mounting structure in which a component is mounted on a substrate, substrate-side first wirings, substrate-side first terminals formed in a mounting area where the component is mounted on the substrate, substrate-side second terminals formed in the mounting area and substrate-side second wirings are disposed over the substrate. Component-side first terminals and component-side second terminals are provided to the component.

11 Claims, 13 Drawing Sheets

MOUNTING STRUCTURE AND ELECTRO OPTICAL DEVICE

BACKGROUND

1. Technical Field

The present invention relates to a mounting structure in which a component such as a flexible printed circuit, an IC, or the like is mounted on a substrate, and to an electro optical device equipped with the same.

2. Related Art

A pixel is formed at a position corresponding to each intersection point of a number of data lines and a number of scanning lines, and a predetermined signal is supplied to each pixel via the data lines and the scanning lines to drive each pixel in an active matrix liquid crystal device, an organic electro-luminescence display device, and an electro optical device such as a plasma display. Accordingly, in the electro optical device, a structure is employed in which a component such as a driving IC, a flexible printed circuit, or the like is mounted on a substrate for holding an electro optical material (for example, see JP-A-2003-66480).

When mounting such a component, as shown in FIG. 12A, when perpendicular two directions on a substrate surface are Second direction and first direction, in general, a plurality of wirings 181 that extends in the First direction to align in parallel with the Second direction are formed so as to reach a mounting area 10g of the component are formed on a substrate 10h, and substrate-side terminals 182 are formed on the wirings 181 in the mounting area 10g. On the other hand, for example, at the side of a flexible printed circuit 15, a plurality of component-side terminals 156 are formed, and as shown in FIG. 12B, when the flexible printed circuit 15 is overlapped with the substrate 10h via an anisotropic conductive film, each of the plurality of component-side terminals 156 is overlapped with corresponding one of the plurality of the substrate-side terminals 182 in plan view, and is electrically connected thereto. Herein, the width size of the substrate-side terminal 182 is same as that of the wiring pattern 181.

As a structure for mounting a connector or the like as the component on the substrate, the structure shown in FIG. 12C has been proposed (see JP-A-2006-73536).

In the mounting structure shown in FIG. 12C, a plurality of substrate-side first wirings 191 that extend in the First direction to align in the Second direction and that reach a mounting area 10j of the component, and a plurality of substrate-side second wirings 192 each of which passes between corresponding two of the substrate-side first wirings 191 adjacent in the Second direction to extend in the First direction and that reach the mounting area 10j are formed on a substrate 10i. Further, a plurality of substrate-side first terminals 196 each of which is arranged on corresponding one of the plurality of the substrate-side first wirings 191 at a side to which the substrate-side first wirings 191 and the substrata side second wring patterns 192 are extended, the plurality of substrate-side first terminals 196 being aligned in the Second direction, are formed in the mounting area 10j, and a plurality of substrate-side second terminals 197 each of which is arranged on a portion of corresponding one of the plurality of substrate-side second wirings 192, the portion being provided where the substrate-side second wiring pattern 192 is passed through between corresponding two of the component-side first terminals 196 adjacent to the substrate-side second wiring pattern 192 in the Second direction, the plurality of substrate-side second terminals 197 being aligned in the Second direction, are formed in the mounting area 10j.

However, in the structure shown in FIGS. 12A, 12B, when the number of the wirings 181 and the number of the substrate-side terminals 182 is increased without extending the mounting area 10g in the Second direction, it is necessary to narrow the pitch of the wirings 181 and the substrate-side terminals 182, or to decrease the width size of the wirings 181 and the substrate-side terminals 182. When the countermeasure is executed, there is a problem in that, for example, a shortcut between adjacent two terminals or an opening between the substrate-side terminal 182 and the component-side terminal 181 occurs when mounting.

Further, in the structure shown in FIG. 12C, the width size of the substrate-side second wiring pattern 192 is partially decreased by the extended amount of the width size of the substrate-side first terminal 196 than that of the substrate-side first wiring pattern 191 in order to assure a sufficient gap between the substrate-side first terminal 196 and the substrate-side second wiring pattern 192. Consequently, when the number of the wirings and the number of the substrate-side terminals is increased without extending the mounting area 10j in the Second direction, there is a problem in that it can not be avoided to decrease the width size of the substrate-side second wirings 192, which increases the wiring resistance.

SUMMARY

An advantage of some aspects of the invention is to provide a mounting structure which makes it possible to provide a good electrical connection between a substrate-side terminal and a component-side terminal even when the number of wiring pattern and the number of substrate-side terminal are increased without extending a mounting area, and to provide an electro optical device equipped with the same.

According to an aspect of the invention, there is provided a mounting structure in which a component is mounted on a substrate. In the mounting structure, substrate-side first wirings which extend in a first direction are disposed over the substrate. Substrate-side first terminals which are connected to corresponding substrate-side first wirings are disposed over the substrate in a mounting area where the component is mounted on the substrate. Substrate-side second wirings which extend in the first direction are disposed on the substrate. The substrate-side second wirings pass between corresponding adjacent two substrate-side first wirings and between corresponding adjacent two substrate-side first terminals. Substrate-side second terminals which are connected to corresponding substrate-side second wirings are disposed over the substrate in the mounting area. Component-side first terminals are provided to the component. One of the component-side first terminals overlaps with the corresponding substrate-side first terminal in plan view and is connected electrically with the corresponding substrate-side first terminal. Component-side second terminals are provided to the component. One of the component-side second terminals overlaps with a corresponding substrate-side second terminal in plan view and is connected electrically with the corresponding substrate-side second terminal. Further, widths Wa1, Wa2, Wf1 and Wf2 satisfy all of the following relationships:

$Wa1 < Wa2$ $Wf1 > Wf2$ $Wa1 < Wf1$ $Wa2 > Wf2;$ wherein
the width Wa1 is a dimension of the substrate-side first terminal in a second direction perpendicular to the first direction, the width Wa2 is a dimension of the substrate-side second terminal in the second direction, the width Wf1 is a dimension of the component-side first terminal in the second direction, and the width Wf2 is a dimension of the component-side second terminal in the second direction, and each of the substrate-side first wirings does not pass between corresponding adjacent two substrate-side second terminals.

In the aspect of the invention "a substrate-side terminal is arranged on a wiring pattern" means to include both structures, a structure in which the substrate-side terminal is formed by using a part of the wiring pattern, and a structure in which the substrate-side terminal is electrically connected with the upper layer side of the wiring pattern via a contact hole of an insulating layer.

In the aspect of the invention, the width size Wa1 of the substrate-side first terminal, the width size Wa2 of the substrate-side second terminal, the width size Wf1 of the component-side first terminal, the width size Wf2 of the component-side second terminal in the Second direction satisfy all of the following relations:

Wa1<Wa2

Wf1>Wf2

Wa1<Wf1

Wa2>Wf2.

In addition, the width size Wa1 of the substrate-side first terminal that is located at a portion to which the substrate-side first wirings and the substrate-side second wirings are extended is narrower than the width size Wa2 of the substrate-side second terminal. Consequently, the substrate-side second wiring pattern can be easily passed trough between the substrate-side first terminals, and shortcut between the substrate-side second wiring pattern and the substrate-side first terminal and occurrence of overlapping of the substrate-side second wiring pattern and the substrate-side first terminal are prevented. Accordingly, at the side of the substrate, even when the number of the wiring pattern and the substrate-side terminal is increased without extending the mounting area, it is not necessary to purposely narrow the width sizes. Further, there is no substrate-side first terminal at a position adjacent to the substrate-side second terminal in the Second direction, so that the substrate-side second terminal can be formed to have an enough width size. Consequently, even when the pitch of the substrate-side first terminals and the pitch of the substrate-side second terminals are narrowed in order to increase the number of the wiring pattern and the substrate-side terminal without extending the mounting area, a problem such as shortcut does not occur. Further, the width size of the component-side first terminal that is connected to the substrate-side first terminal at the side of the component is increased as the width size of the substrate-side first terminal is narrow. On the other hand, the width size of the component-side second terminal that is connected to the substrate-side second terminal at the side of the component is decreased as the width size of the substrate-side second terminal is wide. Consequently, even when the width size of each of the terminals is narrowed, the substrate-side first terminal surely overlaps with the component-side first terminal, and the substrate-side second terminal surely overlaps with the component-side second terminal, so that electrical connection is assured. In addition, the overlapped area of the substrate-side first terminal and the component-side first terminal and the overlapped area of the substrate-side second terminal and the component-side second terminal are equivalent. Consequently, there is an advantage that, for example, the connection resistance of each connection part is equivalent, so that the resistance value of each signal transmission pathway between the substrate and the component is equivalent.

In the aspect of the invention, it is preferable that the substrate-side second wirings linearly extend in the first direction to have a same width Wd2 in the mounting area, and when the width size of a part that is linearly extended is Wd2, the width sizes Wa2, Wd2 satisfy the following relation:

Wd2<Wa2.

That is, as for the substrate-side second terminals, there is a special allowance in the Second direction perpendicular to the first direction. Accordingly, as for the substrate-side second terminals, the width size can be increased than that of the substrate-side second wirings. Accordingly, reliability of an electrical connecting part with the component can be improved.

In the aspect of the invention, it is preferable that the substrate-side first wirings linearly extend in the First direction to have a same width size near the mounting area, and when the width size of a part that is linearly extended is Wd1, the width sizes Wa1, Wd1 satisfy the following relation:

Wa1=Wd1.

That is, as for the substrate-side first terminals, there is no special allowance in the Second direction. However, it is preferable that the width size of the substrate-side first terminal is formed so as to be equivalent to the substrate-side first wiring pattern and the width size is increased to the utmost limit. With the structure, reliability of an electrical connecting part with the component can be improved.

In the aspect of the invention, it is preferable that the substrate-side first wirings are linearly extended in the First direction to have a same width size near the mounting area, and the substrate-side second wirings are linearly extended in the First direction to have a same width size in the mounting area, and when the width size of a part that is linearly extended of the substrate-side first wiring pattern is Wd1, and the width size of a part that is linearly extended of the substrate-side second wiring pattern is Wd2, the width sizes Wd1, Wd2 satisfy the following relation:

Wd1=Wd2.

That is, in the aspect of the invention, the special problem is resolved by modifying the width sizes of the substrate-side first terminal, the substrate-side second terminal, the component-side first terminal, and the component-side second terminal. Accordingly, it is preferable to employ a structure in which the width sizes of both of the substrate-side first wiring pattern and the substrate-side second wring pattern are same and each thereof is linearly extended to have a same width size.

It is preferable that one of the component-side first terminals is electrically connected to corresponding substrate-side first terminal with an anisotropic conductive film that is provided between the substrate and the component in the mounting area, and one of the component-side second terminals is electrically connected to corresponding substrate-side second terminal with the anisotropic conductive film in the aspect of the invention.

It is preferable that the mounting area except for regions where the substrate-side first terminals and the substrate-side second terminals are provided is covered with an insulating layer in the aspect of the invention.

It is preferable that the component is, for example, a flexible printed circuit or an IC in the aspect of the invention. Alternatively, it is preferable that the component is a connector or the like in the aspect of the invention.

According to another aspect of the invention, there is provided an electro optical device in which a component is mounted on a first substrate. In the electro optical device, substrate-side first wirings which extend in a first direction are disposed over the substrate. Substrate-side first terminals which are connected to corresponding substrate-side first wirings are disposed over the substrate in a mounting area where the component is mounted on the substrate. Substrate-side second wirings which extend in the first direction are disposed on the substrate. The substrate-side second wirings pass between corresponding adjacent two substrate-side first wirings and between corresponding adjacent two substrate-side first terminals. Substrate-side second terminals which are connected to corresponding substrate-side second wirings are disposed over the substrate in the mounting area. Component-side first terminals are provided to the component. One of the component-side first terminals overlaps with the corresponding substrate-side first terminal in plan view and is connected electrically with the corresponding substrate-side first terminal. Component-side second terminals are provided to the component. One of the component-side second terminals overlaps with a corresponding substrate-side second terminal in plan view and is connected electrically with the corresponding substrate-side second terminal. Further, widths Wa1, Wa2, Wf1 and Wf2 satisfy all of the following relationships:

Wa1<Wa2

Wf1>Wf2

Wa1<Wf1

Wa2>Wf2;

wherein the width Wa1 is a dimension of the substrate-side first terminal in a second direction perpendicular to the first direction, the width Wa2 is a dimension of the substrate-side second terminal in the second direction, the width Wf1 is a dimension of the component-side first terminal in the second direction, and the width Wf2 is a dimension of the component-side second terminal in the second direction, and each of the substrate-side first wirings does not pass between corresponding adjacent two substrate-side second terminals.

It is preferable that a liquid crystal layer is held between the first substrate and a second substrate which is disposed opposite to the first substrate in the aspect of the invention.

It is preferable that an electro-luminescence element is disposed over the first substrate in the aspect of the invention.

The electro optical device to which the invention is applied is used as a direct-view type display unit of an electronic apparatus such as a mobile phone, a mobile computer, or the like. Further, a liquid crystal device (electro optical device) to which the invention is applied can be used also as a light valve of a projection display device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
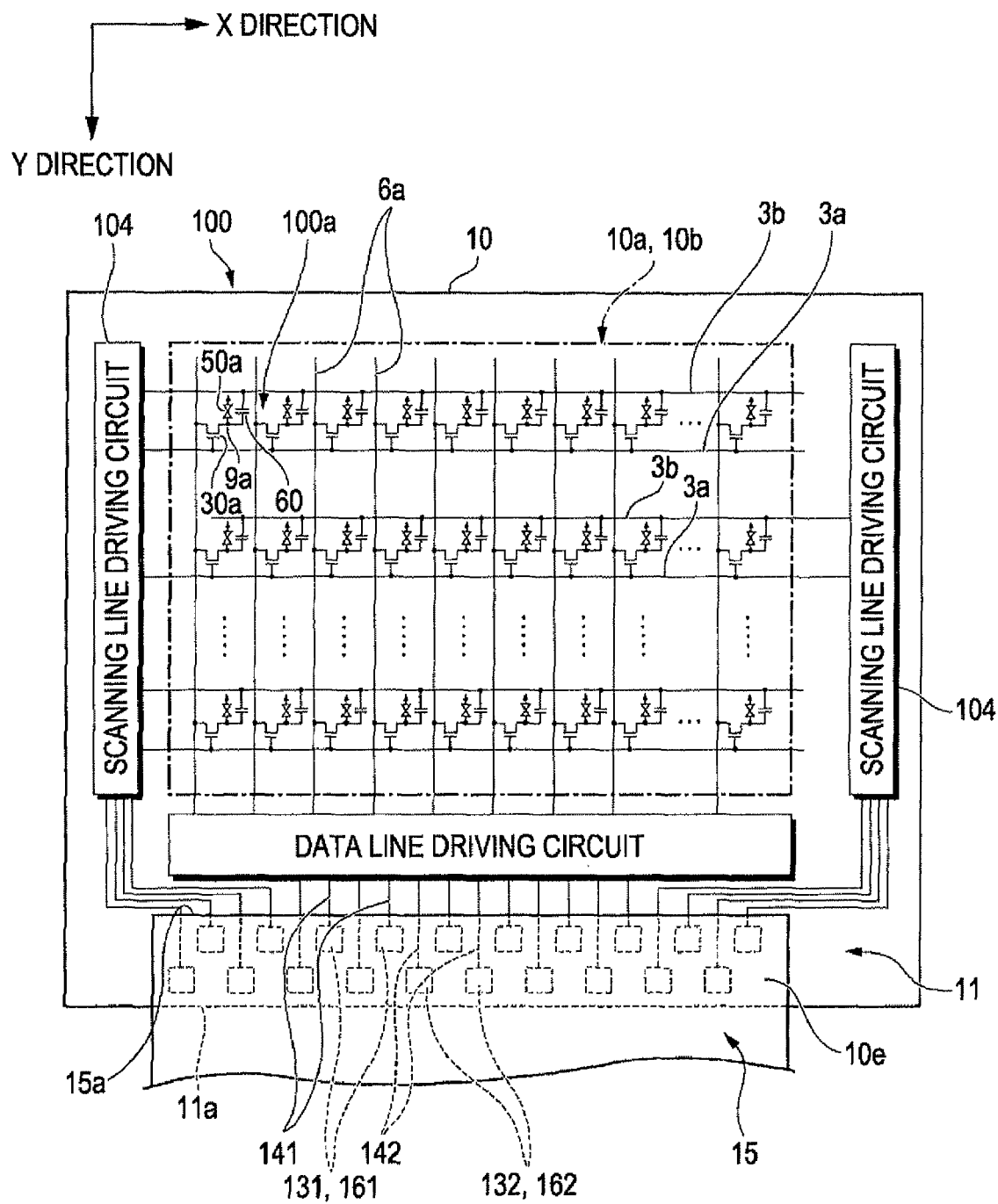
FIG. 1 is an equivalent circuit diagram showing an electrical structure of a first substrate (element substrate/electro optical device substrate) used in an electro optical device (liquid crystal device) according to a first embodiment of the invention.

Hereinafter, examples in each of which an electro optical device such as a liquid crystal device, an organic electroluminescence device, or the like is constituted by using a mounting structure according to the invention will be described as embodiments of the invention. Note that contraction scale is differentiated for the respective layers and respective members in order to show the respective layers and the respective members in recognizable scales in the drawings that are referred in the following description. The source and the drain are replaced in accordance with the voltage to be applied in a thin film transistor. However, in the following description, for the sake of illustration, the description will be made as regards the side to which a pixel electrode is connected is the drain.

First Embodiment 1

Whole Structure

Figure 2A:
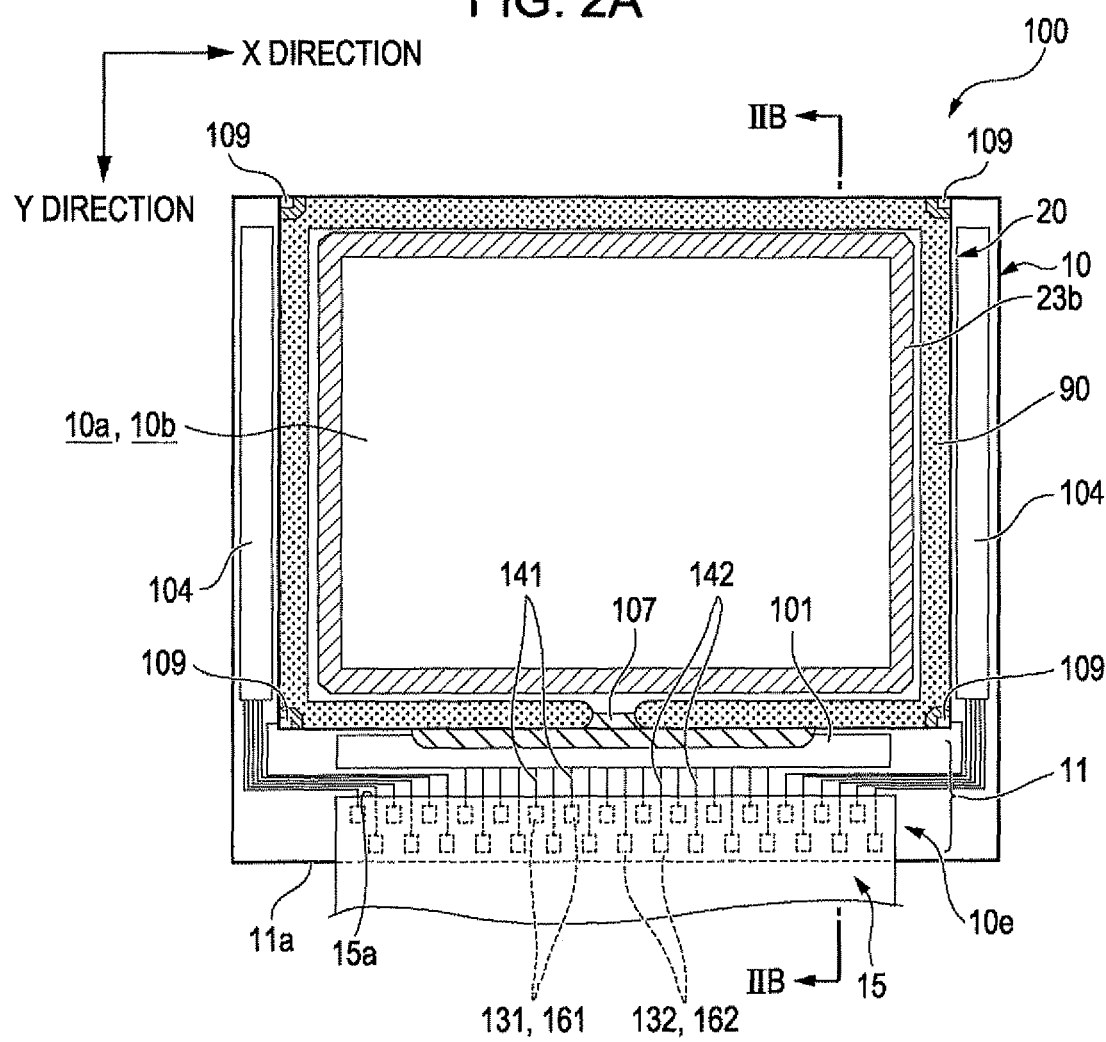
FIG. 2A is a plan view showing the electro optical device according to the first embodiment of the invention viewed from a side of a counter substrate with each constituent element formed thereon.

FIG. 1 is an equivalent circuit diagram showing an electrical structure of a first substrate (element substrate/electro optical device substrate) used in an electro optical device (liquid crystal device) according to a first embodiment of the invention. FIG. 2A is a plan view showing the electro optical device according to the first embodiment of the invention viewed from a side of a counter substrate with each constituent element formed thereon, and FIG. 2B is a cross sectional view thereof taken along the line IIB-IIB of FIG. 2A.

As shown in FIG. 1, an electro optical device 100 according to the embodiment is a liquid crystal device, and a plurality of pixels 100a are formed in a pixel area 10b in a matrix manner. A pixel electrode 9a and a thin film transistor 30a (pixel transistor) for pixel switching for controlling the pixel electrode 9a are formed in each of the plurality of the pixel electrodes 100a. Further, a data line driving circuit 101 and scanning line driving circuits 104 are formed outside the pixel area 10b on the first substrate 10. Data lines 6a that are extended from the data line driving circuit 101 are electrically connected to the sources of the corresponding thin film transistors 30a, and the data line driving circuit 101 supplies an image signal to the data lines 6a in a line sequence manner. The scanning lines 3a that are extended from the scanning line driving circuits 104 are electrically connected to the gates of the corresponding thin film transistors 30a, and the scanning line driving circuits 104 supply a scanning signal to the scanning lines 3a in a line sequence manner. The pixel electrode 9a is electrically connected to the drain of the thin film transistor 30a. In the electric optical device 100, the image signal supplied from the data line 6a is written into a liquid crystal capacitor 50a of each pixel 100a at a predetermined timing by switching the thin film transistor 30a into an on state for a predetermined period. The image signal having a predetermined level that is written into the liquid crystal capacitor 50a is held for a predetermined period between the pixel electrode 9a formed on the first substrate 10 and a common electrode on a counter substrate to be described below. A holding capacitor 60 is formed between the pixel electrode 9a and the common electrode, and the voltage of the pixel electrode 9a is held for a time longer by three digits than the period while a source voltage is applied. Herewith, holding property of electric charge is improved and the electro optical device 100 capable of displaying with a high contrast ratio can be provided. In the embodiment, a capacitor line 3b is formed so as to be in parallel with the scanning line 3a for constituting the holding capacitor 60. However, the holding capacitor 60 may be formed between with the pre-stage scanning line 3a.

Figure 2B:
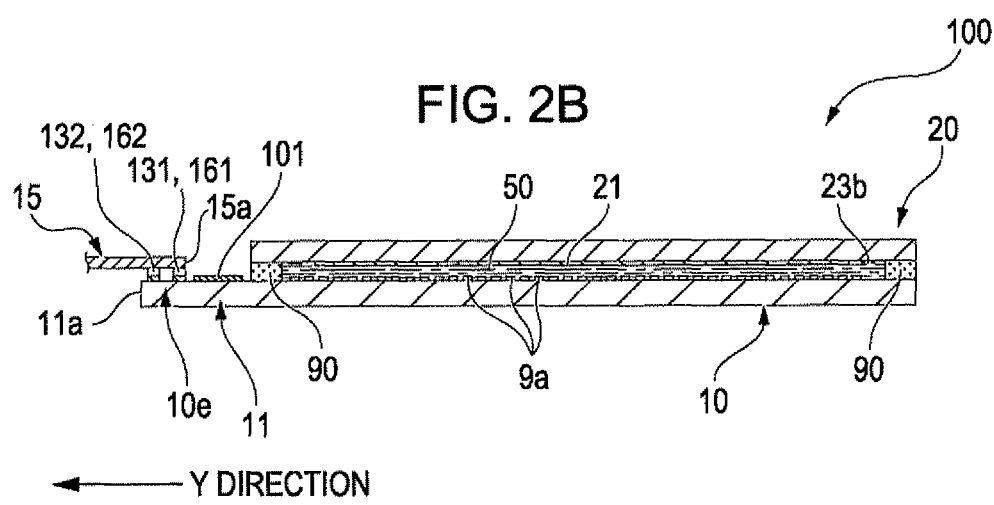
FIG. 2B is a cross sectional view taken along the line IIB-IIB of FIG. 2A.

In FIGS. 2A and 2B, in the electro optical device 100 of the embodiment, a sealing part 90 is provided on the first substrate 10 as an element substrate in a rectangular frame manner, and a second substrate 20 as the counter substrate and the first substrate 10 are bonded together by the sealing part 90. The second substrate 20 and the sealing part 90 are equipped with outlines that are approximately the same, and a liquid crystal layer 50 is held in the area surrounded by the sealing part 90. The liquid crystal layer 50 is formed by, for example, one type of nematic liquid crystal or a mixture of a plurality of types of nematic liquid crystals Note that an inter substrate conducting part 109 for performing electrical connection between the first substrate 10 and the second substrate 20 is provided at each of the corners of the sealing part 90. Further a part of the sealing part 90 is opened, and by using the opening, liquid crystal is filled into the area surrounded by the sealing part 90, and thereafter the opening is sealed by a sealing member 17. Further, in the first substrate 10, the data line driving circuit 101 and the scanning line driving circuits 104 are formed in the area outside the sealing part 90. The driving circuits are simultaneously formed with the thin film transistor 30a for pixel switching by using a semiconductor process.

Herein, the first substrate 10 is larger than the second substrate 20, and is equipped with a projected area 11 projected from the substrate edge of the second substrate 20. In the projected area 11, the data line driving circuit 101 is formed, and a mounting area 10e for mounting a flexible printed circuit 15 that performs electrical connection between the first substrate 10 and an exterior circuit is formed. The detail structure of the mounting area 10e and the like will be described below.

The pixel electrodes 9a are formed on the first substrate 10 in a matrix manner. On the other hand, a frame 23b made of a light shielding material is formed inside the sealing part 90. The area inside the frame 23b is an image display area 10a. The common electrode 21 and the like are formed on the second substrate 20. Note that the common electrode is formed on the first substrate 10 similarly to the pixel electrodes 9a in the case of a fringe field switching (FFS) mode liquid crystal device.

In the electro optical device 100 structured in this manner, the image display area 10a overlaps the pixel area 10b that is described with reference to FIG. 1. However, there is a case that a dummy pixel that does not directly contribute for displaying is formed along the outer circumference of the pixel area 10b. In this case, the pixel display area 10a is constituted by the area of the pixel area 10b except the dummy pixel.

Structure of Terminals and Wirings

Figure 3A:
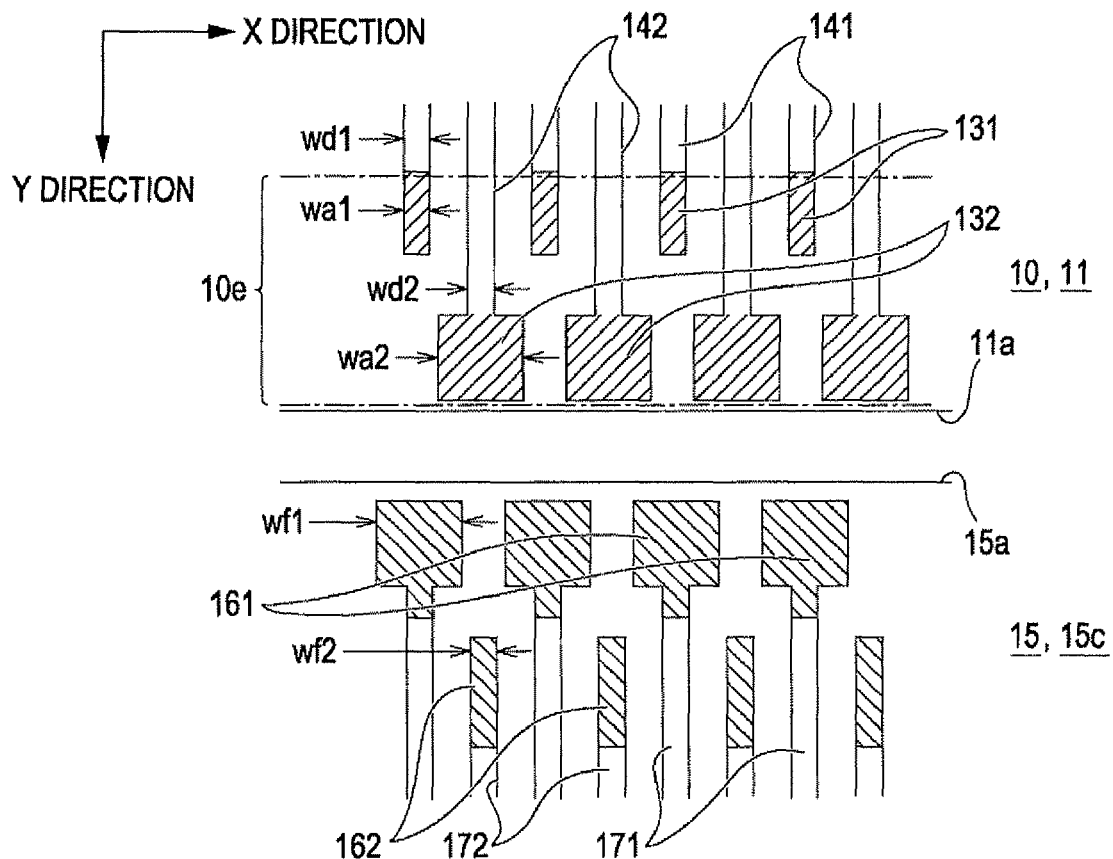
FIG. 3A is an explanatory diagram schematically showing a planer structure of wirings and terminals that are formed in a projected area of the first substrate and an end of a flexible printed circuit.
Figure 3B:
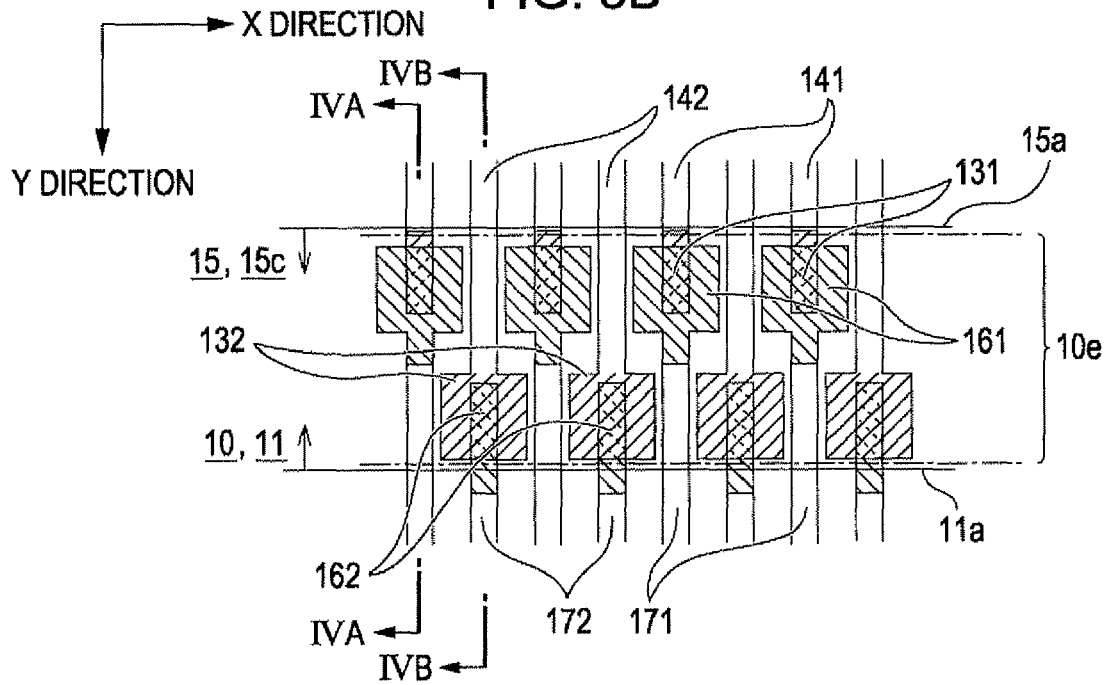
FIG. 3B is an explanatory diagram schematically showing a planer structure of an appearance when the end of the flexible printed circuit is overlapped with the projected area of the first substrate to electrically connect the terminals to each other, in the electro optical device according to the first embodiment of the invention.
Figure 4A:
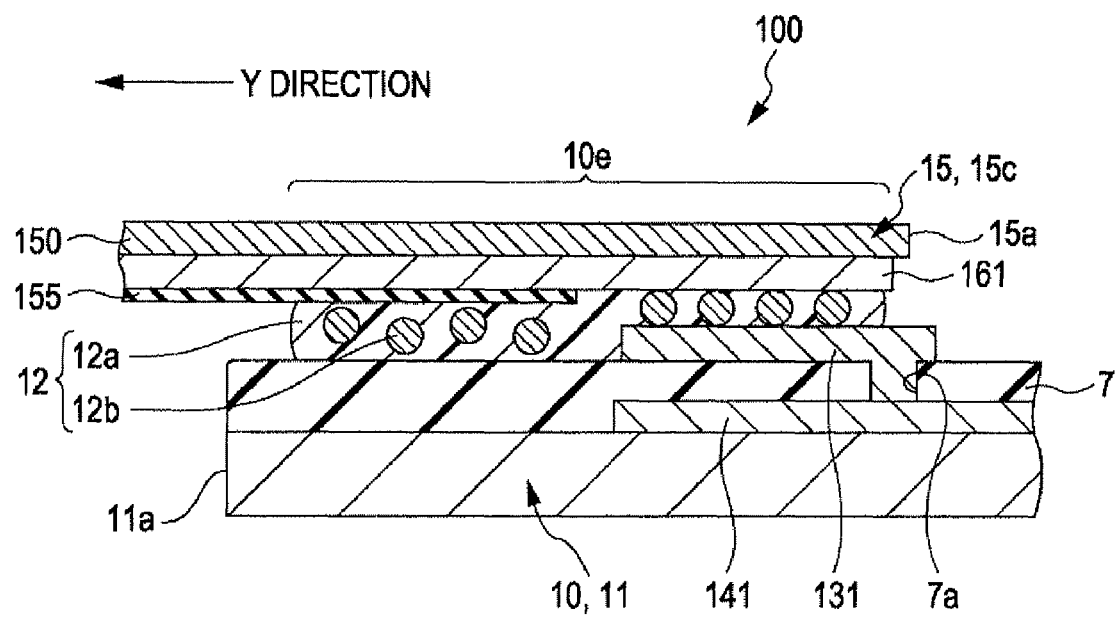
FIG. 4A is an explanatory diagram schematically showing a cross sectional structure of a mounting area taken along the line IVA-IVA of FIG. 3B.
Figure 4B:
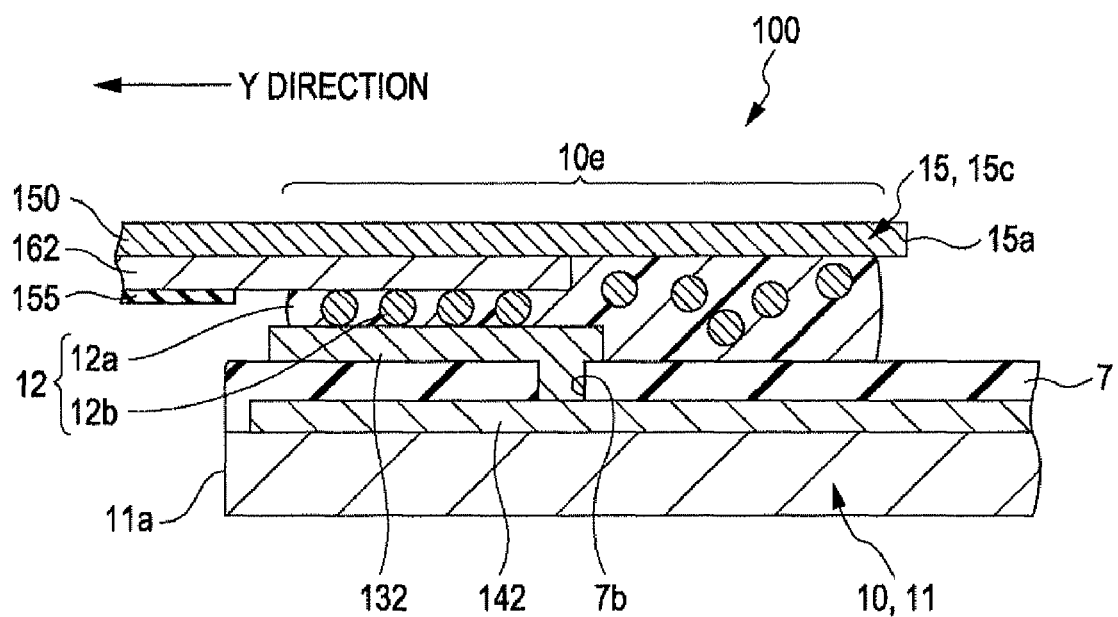
FIG. 4B is an explanatory diagram schematically showing a cross sectional structure of the mounting area taken along the line IVB-IVB of FIG. 3B.

FIG. 3A is an explanatory diagram schematically showing a planer structure of wirings and terminals that are formed in the projected area of the first substrate 10 and an end of the flexible printed circuit 15, and FIG. 3B is an explanatory diagram schematically showing a planer structure of an appearance when the end of the flexible printed circuit 15 is overlapped with the projected area of the first substrate 10 to electrically connect the terminals to each other, in the electro optical device according to the first embodiment of the invention. FIG. 4A is an explanatory diagram schematically showing a cross sectional structure of the mounting area taken along the line IVA-IVA of FIG. 3B, and FIG. 4B is an explanatory diagram schematically showing a cross sectional structure of the mounting area taken along the line IVB-IVB of FIG. 3B. Note that only a part of the plurality of terminals and wirings is shown in FIGS. 3A to 4B.

As shown in FIGS. 1, 2A and 2B, in the electro optical device 100 according to the embodiment, it is necessary to mount the flexible printed circuit 15 in the mounting area 10e of the first substrate 10 and to supply a signal and a constant electrical potential to the data line driving circuit 101 and the scanning line driving circuits 104 from outside via the flexible printed circuit 15 in order to output an image signal and a scanning signal from the data line driving circuit 101 and the scanning line driving circuits 104.

In the embodiment, as shown in FIGS. 1, 2A, 2B and 3A, first, when perpendicular two directions on the substrate surface of the first substrate 10 are X direction, i.e. second direction, and Y direction, i.e. first direction, a plurality of substrate-side first wirings 141 that extend in the First direction to align in the Second direction and that reach the mounting area 10e, and a plurality of substrate-side second wirings 142 each of which passes between corresponding two of the substrate-side first wirings 141 adjacent in the Second direction to extend in the First direction and that reach the mounting area 10e are formed on the first substrate 10.

Further, at the side to which the substrate-side first wirings 141 and the substrate-side second wirings 142 are extended (the side at which the pixel area 10b is located) in the mounting area 10e of the first substrate 10, a plurality of substrate-side first terminals 131 (areas in which positive-slope lines are drawn on the substrate first wirings 141 in FIG. 3A) are formed on the plurality of substrate-side first wirings 141, and the plurality of substrate-side first terminals 131 are arranged on a straight line in the Second direction. Further, in the mounting area 10e of the first substrate 10, a plurality of substrate-side second terminals 132 (areas in which positive-slope lines are drawn on the substrate second wirings 142 in FIG. 3A) are formed on portions of the plurality of the substrate-side second wirings 142 that are provided where the substrate-side second wiring pattern 142 is passed trough between the substrate-side first terminals 131 adjacent to the substrate-side second wiring pattern 142 in the Second direction. The plurality of substrate-side second terminals 132 are arranged on a straight line in the Second direction at the side near a substrate edge 11a of the first substrate 10 than the substrate-side first terminals 131.

Herein, the substrate-side first wirings 141 and the substrate-side second wirings 142 are linearly aligned with a same pitch in the mounting area 10e and the vicinity thereof. Consequently, the plurality of substrate-side first terminals 131 are aligned in the Second direction with a same pitch, and the plurality of the substrate-side second terminals 132 are aligned in the Second direction with a same pitch. The pitch of the substrate-side first terminals and the pitch of the substrate-side second terminals are twice as the pitch of the substrate-side wirings 141 and the substrate-side second wirings 142. Further, the substrate-side first terminals 131 are misaligned with respect to the substrate-side second terminals 132 by ½ pitch in the Second direction, and the substrate-side second terminals 132 are misaligned with respect to the substrate-side first terminals 131 by ½ pitch in the Second direction.

As shown in FIGS. 4A, 4B, in the embodiment, an insulating layer 7 is formed on the substrate-side first wirings 141 and the substrate-side second wirings 142 in the first substrate 10, and contact holes 7a, 7b are formed in the insulating layer 7. A conducting film is formed on the insulating layer 7, and the conducting film is electrically connected to the substrate-side first wiring pattern 141 and the substrate-side second wiring pattern 142 via the contact holes 7a, 7b to constitute the substrate-side first terminal 131 and the substrate-side second terminal 132. Consequently, the mounting area 10e is covered with the insulating layer 7 except the surface of the substrate-side first terminals 131 and the substrate-side second terminals 132.

As shown in FIGS. 1, 2A, 2B, and 3A, a plurality of component-side first terminals 161 are formed at positions overlapped with each of the plurality of substrate-side first terminals 131 in plan view and a plurality of component-side second terminals 162 are formed at positions overlapped with each of the plurality of substrate-side second terminals 132 in plan view when an end 15c of the flexible printed circuit 15 is overlapped with the mounting area 10e of the first substrate 10. That is, at the end 15c of the flexible printed circuit 15, the plurality of component-side first terminals 161 are formed on a straight line along a substrate edge 15a of the flexible printed circuit 15. Similarly to the component-side first terminals 161, the plurality of component-side second terminal 162 are arranged on a straight line along the substrate edge 15a of the flexible printed circuit 15 at positions apart from the substrate edge 15a of the flexible printed circuit 15.

As shown in FIGS. 3A, 4A, and 4B, both of the component-side first terminals 161 and the component-side second terminals 162 are conducting patterns formed on the surface of a film-like insulating base material 150 constituting the flexible printed circuit 15. Component-side first wirings 171 pass through between the component-side second terminals 162 to be linearly extended from the component-side first terminals 161, and component-side second wirings 172 path between the component-side first wirings 171 to be linearly extended from the component-side second terminals 162 on the surface of the insulating base material 150. Further, in the flexible printed circuit 15, the surfaces of the component-side first wirings 171 and the component-side second wirings 172 are covered with an insulating layer 155 except the component-side first terminals 161 and the component-side second terminals 162. Accordingly, negative-slope lines are drawn at the portions corresponding to the component-side first terminals 161 and the component-side second terminals 162 among the component-side first wirings 171 and the component-side second wirings 172 in FIG. 3A.

In the embodiment, the component-side first wirings 171 and the component-side second wirings 172 are linearly extended with a same pitch at the edge of the flexible printed circuit 15. Consequently, the plurality of component-side first terminals 161 are aligned in the Second direction with a same pitch, and the plurality of the component-side second terminals 162 are aligned in the Second direction with a same pitch. The pitch of the component-side first terminals 161 and the pitch of the component-side second terminals 162 are twice of the pitch of the component-side wirings 171 and the component-side second wirings 172, and the same as the pitch of the substrate-side first terminals 131 and the substrate-side second terminal 132. Further, the component-side first terminals 161 are misaligned with respect to the component-side second terminals 162 by ½ pitch in the Second direction, and the component-side second terminals 162 are misaligned with respect to the component-side first terminals 161 by ½ pitch in the Second direction.

Mounting Structure

In order to connect the flexible printed circuit 15 to the first substrate 10 structured in this manner, as shown in FIGS. 3B, 4A and 4B, after an anisotropic conductive film 12 is disposed in the mounting area 10e of the first substrate 10, the end 15c of the flexible printed circuit 15 is overlapped therewith. Then, the overlapped portion is cooled after heated in the state. As a result, the end 15c of the flexible printed circuit 15 is fixed to the mounting area 10e of the first substrate 10 by a resin matrix 12a of the anisotropic conductive film 12. Further, by electro conductive particles 12b that are dispersed in the resin matrix 12a of the anisotropic conductive film 12, the substrate-side first terminal 131 and the component-side first terminal 161 are electrically connected, and the substrate-side second terminal 132 and the component-side second terminal 162 are electrically connected.

Width Sizes of Terminals and Wirings

In the mounting area 10e structured in this manner, when the size of the substrate-side first terminal 131 in the Second direction is width size Wa1, the size of the substrate-side second terminal 132 in the Second direction is width size Wa2, the size of the component-side first terminal 131 in the Second direction is width size Wf1, and the size of the component-side second terminal 162 in the Second direction is width size Wf2, the width sizes Wa1, Wa2, Wf1, Wf2 satisfy all of the following relations:

Wa1<Wa2

Wf1>Wf2

Wa1<Wf1

Wa2>Wf2.

That is, at the side of the first substrate 10, the width size Wa1 of the substrate-side first terminal 131 is narrower than the width size Wa2 of the substrate-side second terminal 132, and at the side of the flexible printed circuit 15, the width size Wf1 of the component-side first terminal 161 that overlaps with the substrate-side first terminal 131 in plan view is wider than the width size Wf2 of the component-side second terminal 162 that overlaps with the substrate-side second terminal 132 in plan view. Further, in the substrate-side first terminal 131 and the component-side first terminal 161 that are overlapped with each other in plan view, the width size Wa1 of the substrate-side first terminal 131 at the side of the first substrate 10 is narrower than the width size Wf1 of the component-side first terminal 161, whereas the width size Wa2 of the substrate-side second terminal 132 at the side of the first substrate 10 is wider than the width size Wf2 of the component-side second terminal 162.

Further, the substrate-side second wirings 142 are linearly extended with a same width size in the First direction in the mounting area 10e, and when the width size of the part that is linearly extended is Wd2, the width sizes Wa2, Wd2 satisfy the following relation:

Wd2<Wa2.

That is, as for the substrate-side second terminals 132, there is a special allowance in the Second direction. Accordingly, as for the substrate-side second terminals 132, the width size can be increased than that of the substrate-side second wirings 142.

Further, the substrate-side first wirings 141 are linearly extended with a same width size in the First direction near the mounting area 10e, and when the width size of the part that is linearly extended is Wd1 the width sizes Wa1, Wd1 satisfy the following relation:

Wa1=Wd1.

That is, as for the substrate-side first terminals 131, there is no special allowance in the Second direction, However the width size of the substrate-side first terminal 131 is formed so as to be equivalent to the substrate-side first wiring pattern 141, and the width size is increased to the utmost limit.

Further, the width sizes Wd1, Wd2 satisfy the following relation.

Wd1=Wd2

That is, the width sizes of the substrate-side first wiring pattern 141 and the substrate-side second wiring pattern 142 are the same.

Main Effect of Embodiment

Figure 5:
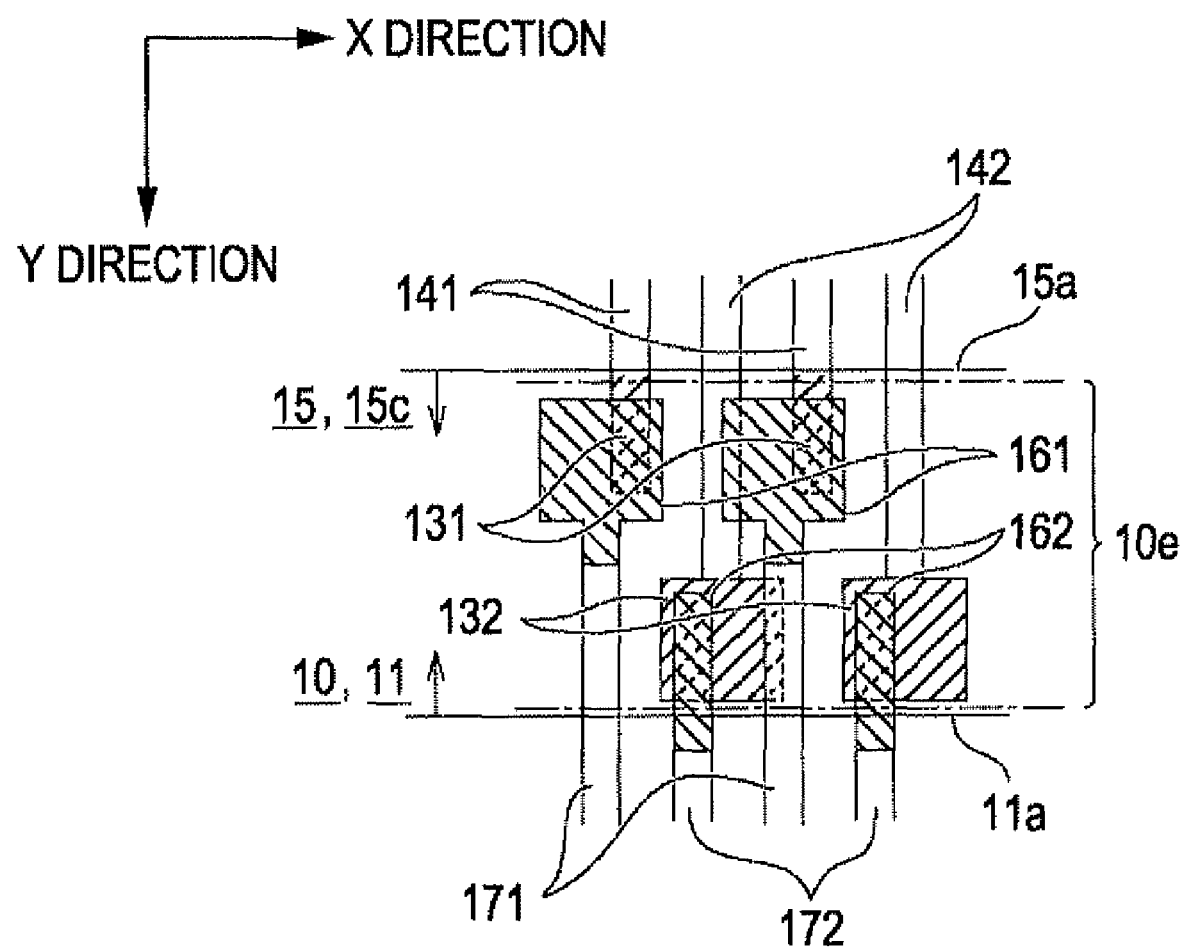
FIG. 5 is an explanatory diagram schematically showing a planer structure when the positional relationship between the first substrate and the flexible printed circuit is deviated in Second direction in the mounting are shown in FIG. 33.

FIG. 5 is an explanatory diagram schematically showing a planer structure when the positional relationship between the first substrate 10 and the flexible printed circuit 15 is deviated in the Second direction in the mounting are 10e shown in FIG. 3B.

As described above, in the electro optical device 100 of the embodiment, the first substrate 10 and the flexible printed circuit 15 constitute a mounting structure. In the mounting structure, the plurality of substrate-side first terminals 131 and the plurality of substrate-side second terminals 132 that are aligned in the Second direction are arranged in two rows in the First direction. Further, the substrate-side first terminals 131 and the substrate-side second terminals 132 are formed at positions deviated in the Second direction. Also in the flexible printed circuit 15, the plurality of component-side first terminals 161 and the component-side second terminals 162 are arranged in two rows in the First direction and the component-side first terminals 161 and the component-side second terminals 162 are formed at positions deviated in the Second direction so as to correspond to the arrangement of the substrate-side first terminals 131 and the substrate-side second terminals 132.

Herein, the width size Wa1 of the substrate-side first terminal 131, the width size Wa2 of the substrate-side second terminal 132, the width size Wf1 of the component-side first terminal 161, the size Wf2 of the component-side second terminal 162 in the Second direction satisfy the following relations:

Wa1<Wa2

Wf1>Wf2

Wa1<Wf1

Wa2>Wf2.

The width size Wa1 of the substrate-side first terminal 131 is narrower than the width size Wa2 of the substrate-side second terminal 132. Accordingly, the substrate-side second wiring pattern 142 can be easily passed trough between the substrate-side first terminals 131, so that it is not necessary to form a needless step on the surface of the substrate-side first terminal 131. Accordingly, it is not necessary to purposely narrow the width sizes of the substrate-side first terminal 131 and the substrate-side second wiring pattern 142 even when the number of the wiring pattern and the substrate-side terminal are increased without extending the mounting area 10e at the first substrate 10 side. Further, as for the substrate-side second terminals 132, there is no substrate-side first terminal 131 at the position adjacent in the Second direction. Accordingly, the substrate-side second terminals 132 can be formed to have an enough width size.

Further, the width size of the component-side first terminal 161 that is connected to the substrate-side first terminal 131 at the side of the flexible printed circuit 15 is increased as the width size of the substrate-side first terminal 131 is narrower than that of the substrate-side second terminal 132. On the other hand, the width size of the component-side second terminal 162 that is connected to the substrate-side second terminal 132 at the side of the flexible printed circuit 15 is decreased as the width size of the substrate-side second terminal 132 is wider than that of the substrate-side first terminal 131. Consequently, the substrate-side first terminal 131 surely overlaps with the component-side first terminal 161, and the substrate-side second terminal 132 surely overlaps with the component-side second terminal 162, so that electrical connection is assured. In addition, the overlapped area of the substrate-side first terminal 131 and the component-side first terminal 161 and the overlapped area of the substrate-side second terminal 132 and the component-side second terminal 162 are equivalent. Consequently, there is an advantage that, for example, the connection resistance of each connection part is equivalent, so that the resistance value in each signal transmission pathway between the first substrate 10 and the flexible printed circuit 15 is equivalent.

In addition, as shown in FIG. 5, even when the positional relationship between the first substrate 10 and the flexible printed circuit 15 is deviated in the Second direction, the substrate-side first terminal 131 surely overlaps with the component-side first terminal 161 and the substrate-side second terminal 132 surely overlaps with the component-side second terminal 162, so that electrical connection is assured. In addition, the overlapped area of the substrate-side first terminal 131 and the component-side first terminal 161 and the overlapped area of the substrate-side second terminal 132 and the mounting part side second terminal 162 are equivalent. Accordingly, even when the positional relationship between the first substrate 10 and the flexible printed circuit 15 is deviated in the Second direction, the connection resistance of each connection part is equivalent. Accordingly, the resistance value in each signal transmission pathway between the first substrate 10 and the flexible printed circuit 15 is equivalent.

In the first substrate 10, the mounting area 10e is covered with the insulating layer 7 except the surface of the substrate-side first terminals 131 and the substrate-side second terminals 132. Accordingly, as shown in FIG. 5, even when the positional relationship between the first substrate 10 and the flexible printed circuit 15 is largely deviated in the Second direction, short circuit between the component-side first terminal 161 and the substrate-side second wiring pattern 142 can be prevented. Further, the flexible printed circuit 15 is covered with the insulating layer 155 except the surface of the component-side first terminals 161 and the component-side second terminals 162 at the end 15c. Accordingly, even when the positional relationship between the first substrate 10 and the flexible printed circuit 15 is largely deviated in the Second direction as shown in FIG. 5, short circuit between the substrate-side second terminal 132 and the component-side first wiring pattern 171 is prevented.

In addition, the substrate-side second wirings 142 are linearly extended to have a same width size in the First direction in the mounting area 10e, and the width size Wd2 of the part that is linearly extended and the width size Wa2 of the substrate-side second terminal 132 satisfies the following relation:

$Wd2<Wa2$.

That is, as for the substrate-side second terminals 132, there is a special allowance in the Second direction. Accordingly, as for the substrate-side second terminals 132, the width size can be increased than that of the substrate-side second wirings 142. Accordingly, reliability of an electrical connecting part with the flexible printed circuit 15 can be improved.

In addition, the substrate-side first wirings 141 are linearly extended to have a same width size in the First direction near the mounting area 10e, and the width size Wd1 of the part that is linearly extended and the width size Wa1 of the substrate-side first terminal 131 satisfy the following relation:

$Wa1=Wd1$.

That is, as for the substrate-side first terminals 131, there is no special allowance in the Second direction. However, the width size of the substrate-side first terminal 131 is formed so as to be equivalent to the substrate-side first wiring pattern 141, and the width size is increased to the utmost limit. Accordingly, the reliability of the electrically connection part with the flexible printed circuit 15 can be improved.

Furthermore, the width size Wd1 of the substrate first wiring pattern 141 near the mounting area 10e, and the width size Wd2 of the substrate-side second wiring pattern 142 in the mounting area 10e satisfy the following relation:

$Wd1=Wd2$.

That is, the width size of the substrate-side first wiring pattern 141 and the width size of the substrate-side second wiring pattern 142 are same Consequently, the resistance value in each signal transmission pathway via the substrate-side wiring pattern 141 and the substrate-side second wiring pattern 142 on the first substrate 10 is equivalent.

Second Embodiment

Figure 6A:
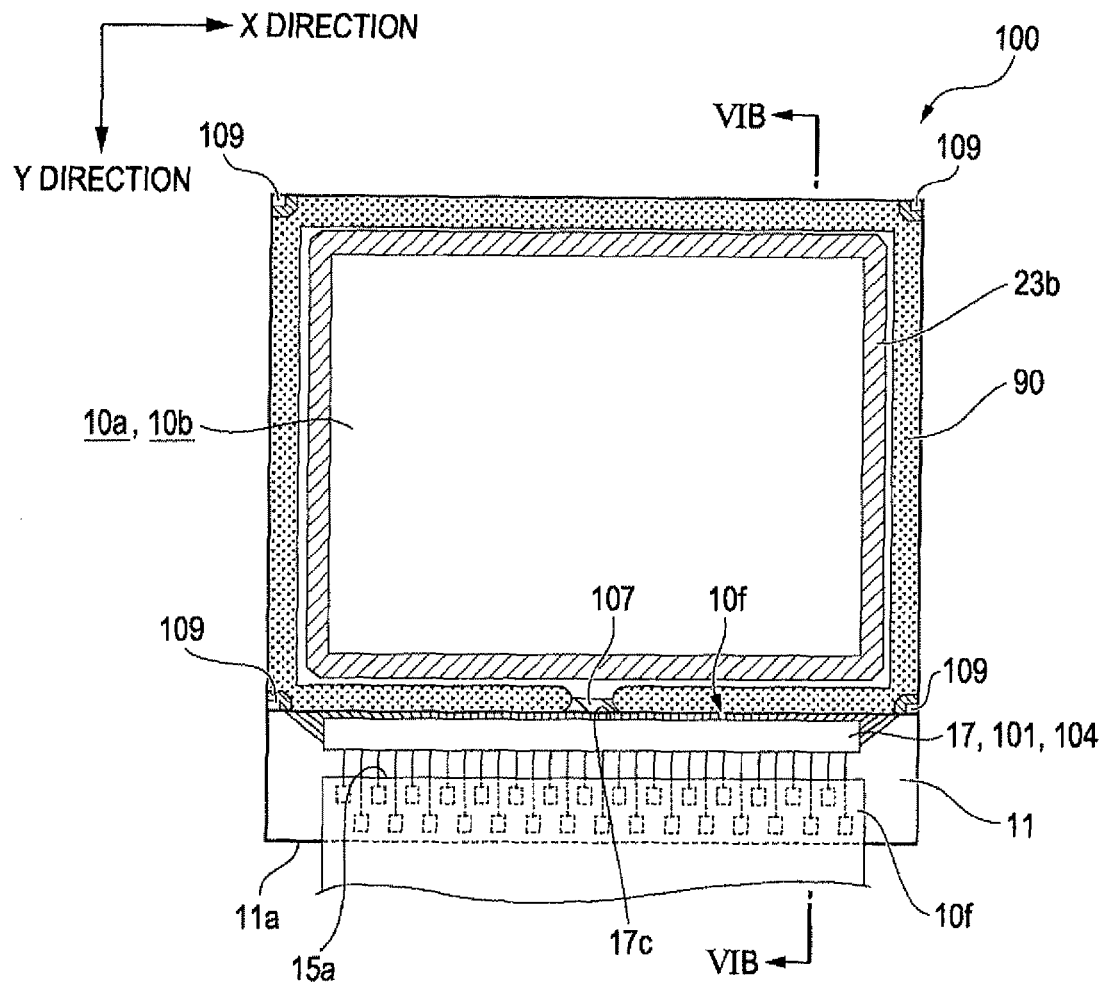
FIG. 6A is a plan view showing an electro optical device (liquid crystal device) according to a second embodiment of the invention viewed from a side of a counter substrate with each constituent element formed thereon.
Figure 6B:
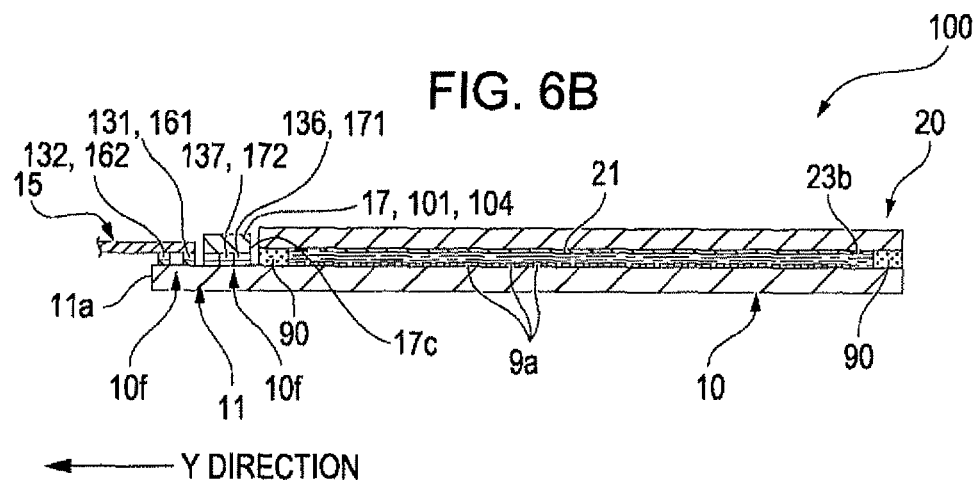
FIG. 6B is a cross sectional view taken along the line VIB-VIB of FIG. 6A.
Figure 7A:
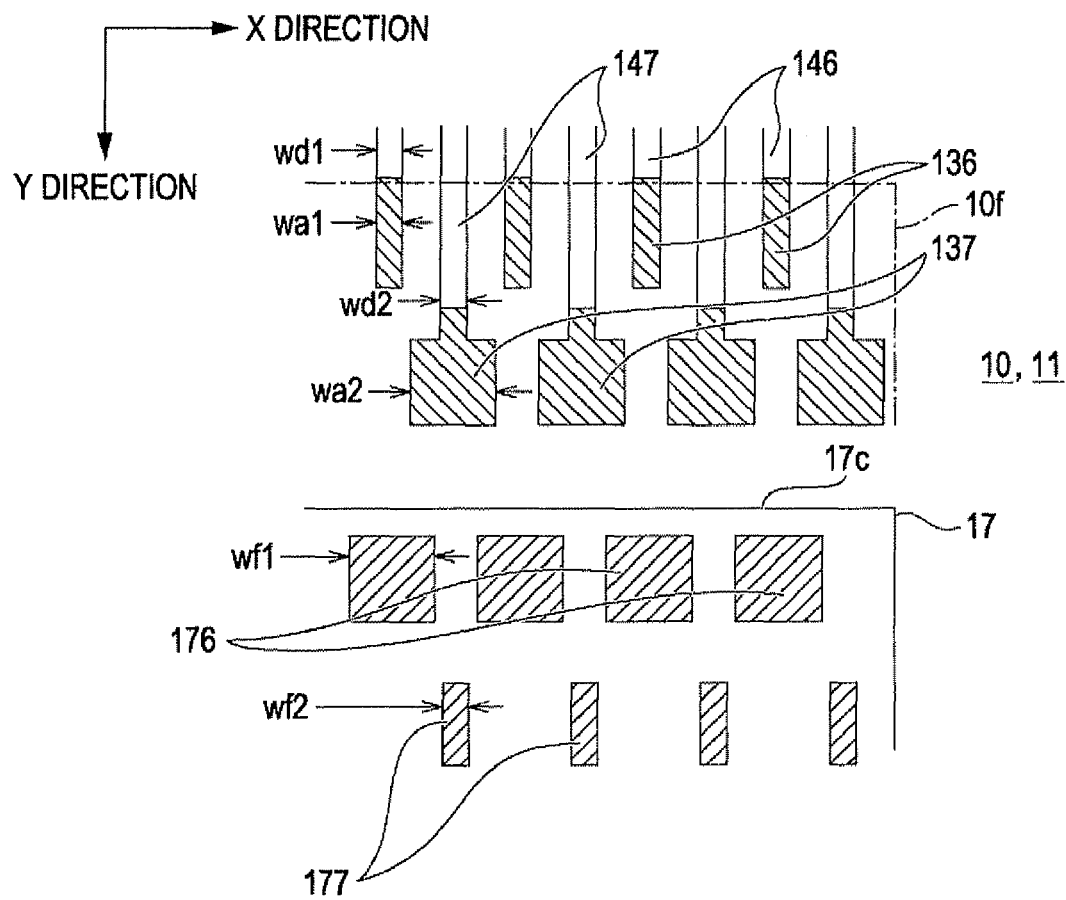
FIG. 7A is an explanatory diagram schematically showing a planer structure of wirings and terminals formed in a projected area of the first substrate and a driving IC.
Figure 7B:
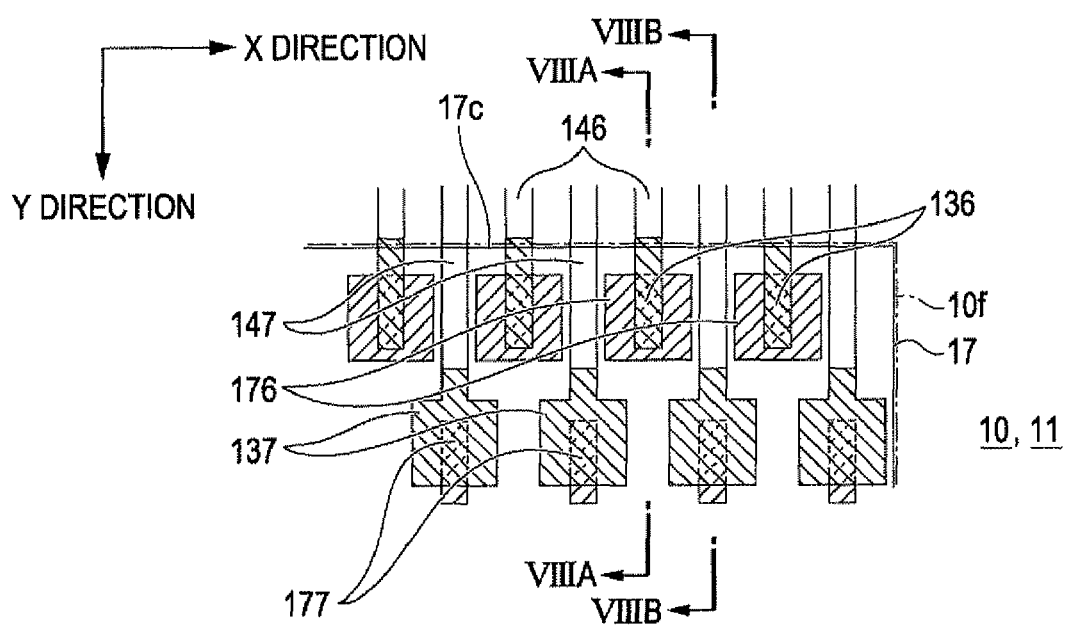
FIG. 7B is an explanatory diagram schematically showing a planer structure of an appearance when the driving IC is overlapped with the projected area of the first substrate and the terminals thereof are electrically connected to each other, in the electro optical device according to the second embodiment of the invention.
Figure 8A:
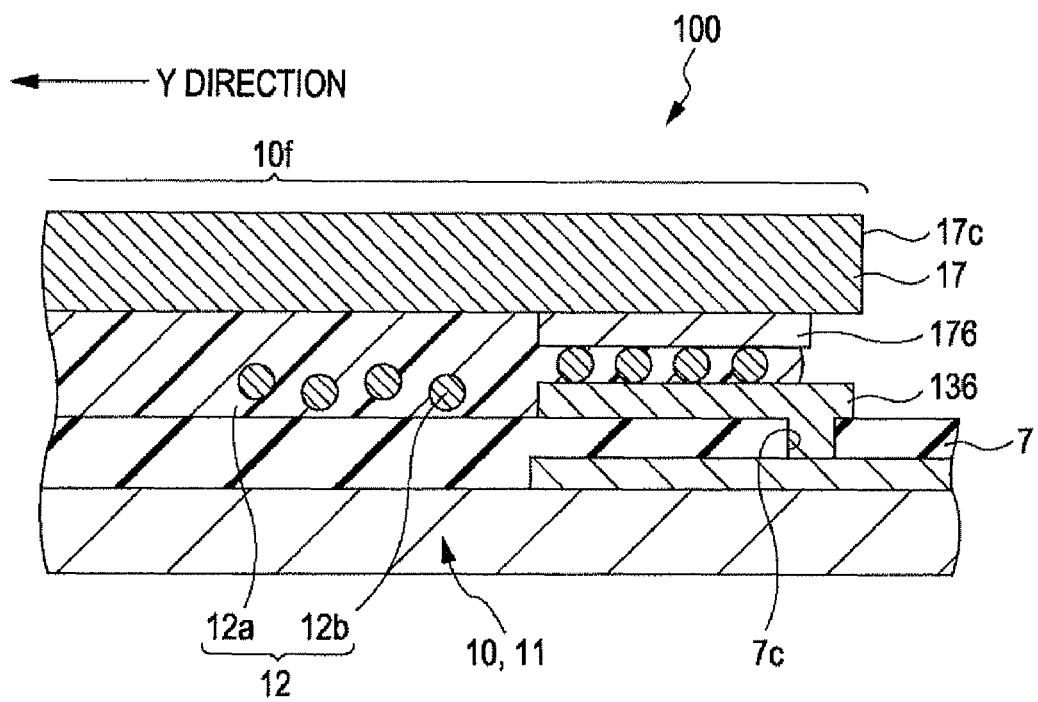
FIG. 8A is an explanatory diagram schematically showing a cross sectional structure of a mounting area taken along the line VIIIA-VIIIA of FIG. 7B.
Figure 8B:
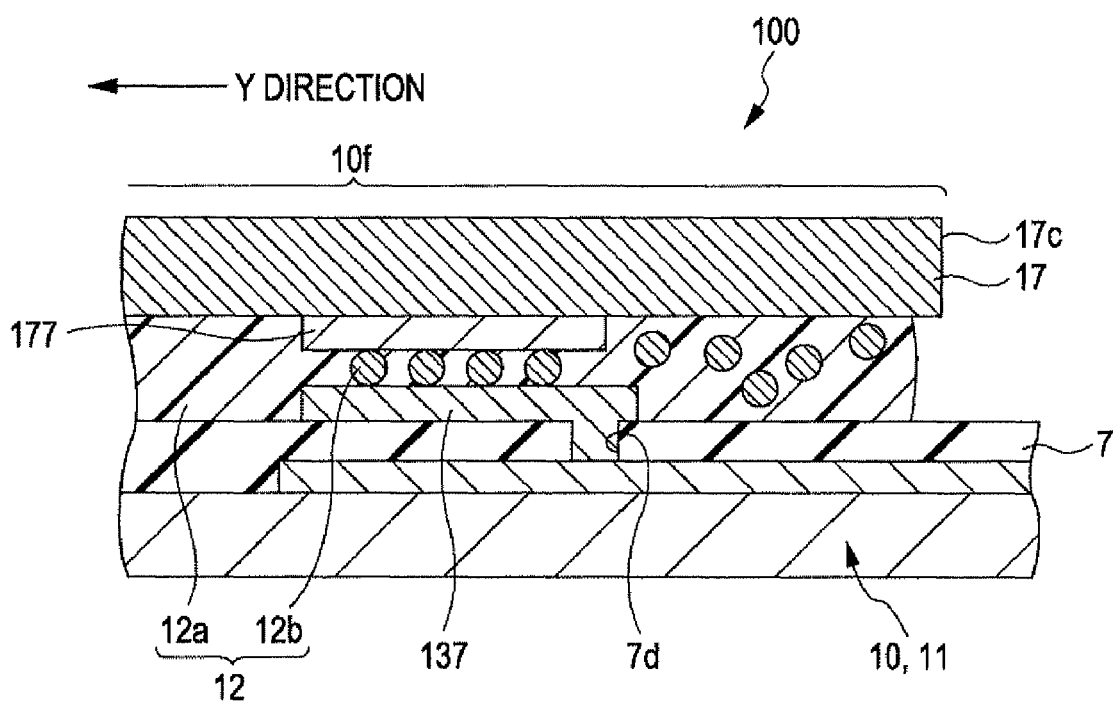
FIG. 8E is an explanatory diagram schematically showing a cross sectional structure of the mounting area taken along the line VIIIB-VIIIB of FIG. 7B.

FIG. 6A is a plan view showing an electro optical device (liquid crystal device) according to a second embodiment of the invention viewed from a side of a counter substrate with each constituent element formed thereon, and FIG. 6B is a cross sectional view thereof taken along the line VIB-VIB of FIG. 6A. FIG. 7A is an explanatory diagram schematically showing a planer structure of wirings and terminals formed in a projected area of the first substrate 10 and a driving IC, and FIG. 7B is an explanatory diagram schematically showing a planer structure of an appearance when the driving IC is overlapped with the projected area of the first substrate 10 and the terminals thereof are electrically connected to each other, in the electro optical device according to the second embodiment of the invention. An end among the mounting area of the driving IC at the pixel area side is magnified in FIGS. 7A, 7B. FIG. 8A is an explanatory diagram schematically showing a cross sectional structure of the mounting area taken along the line VIIIA-VIIIA of FIG. 7B, and FIG. 8B is an explanatory diagram schematically showing a cross sectional structure of the mounting area taken along the line VIIIB-VIIIB of FIG. 7B. Note that the basic structure of the embodiment is the same as that of the first embodiment, so that the same reference numeral is used to denote the same element in the drawings and the description will be omitted.

In the first embodiment, the data line driving circuit 101 and the scanning line driving circuits 104 are simultaneously formed with the thin film transistor 30a for pixel switching on the first substrate 10 by using a semiconductor process, and the invention is applied to the connection between the first substrate 10 and the flexible printed circuit 15. However, in the embodiment, as shown in FIGS. 6A and 6B, the driving IC 17 in which the data line driving circuit 101 and the scanning line driving circuit 104 are incorporated is mounted in the projected area 11 of the first substrate 10. Accordingly, an example in which the invention is applied to a mounting area 10f of the driving IC 17 will be described.

In the embodiment, as shown in FIGS. 6A, 6B, 7A, and 7B, first, when perpendicular two directions on the substrate surface of the first substrate 10 are Second direction and First direction, a plurality of substrate-side first wirings 146 that extend in the First direction to align in the Second direction and that reach the mounting area 10f, and a plurality of substrate-side second wirings 147 each of which passes between corresponding two of the substrate-side first wirings 146 adjacent in the Second direction to extend in the First direction and that reach the mounting area 10f are formed on the first substrate 10.

Further, at the side to which the substrate-side first wirings 146 and the substrate-side second wirings 147 are extended (the side at which the pixel area 10b is located) in the mounting area 10f of the first substrate 10, a plurality of substrate-side first terminals 136 are formed on the plurality of substrate-side first wirings 146, and the plurality of substrate-side first terminals 136 are arranged on a straight line in the Second direction. Further, in the mounting area 10f of the first substrate 10, a plurality of substrate-side second terminals 137 are formed on portions of the plurality of the substrate-side second wirings 147 that are provided where the substrate-side second wiring pattern 147 is passed trough between the substrate-side first terminals 136 adjacent to the substrate-side second wiring pattern 147 in the Second direction. The plurality of substrate-side second terminals 137 are arranged on a straight line in the Second direction at the side near the substrate edge 11a of the first substrate 10 than the substrate-side first terminals 132.

As shown in FIGS. 5A, 8B, the insulating layer 7 is formed on the substrate-side first wirings 146 and the substrate-side second wirings 147 on the first substrate 10, and contact holes 7c, 7d are formed in the insulating layer 7. A conducting film is formed on the insulating layer 7, and the conducting film is electrically connected to the substrate-side first wiring pattern 146 and the substrate-side second wiring pattern 147 via the contact holes 7c, 7d to constitute the substrate-side first terminal 136 and the substrate-side second terminal 137. Consequently, the mounting area 10f is covered with the insulating layer 7 except the surface of the substrate-side first terminals 136 and the substrate-side second terminals 137.

As shown in FIGS. 6A, 6B, and 7A, a plurality of component-side first terminals 176 are formed at positions overlapped with each of the plurality of substrate-side first terminals 136 in plan view, and a plurality of component-side second terminals 177 are formed at positions overlapped with each of the plurality of substrate-side second terminals 137, when the driving IC 17 is overlapped with the mounting area 10f of the first substrate 10. That is, the plurality of component-side first terminals 176 are formed on a straight line at an end 17c of the driving IC 17, and the plurality of component-side second terminals 177 are arranged on a straight line similarly to the component-side first terminals 176 at a position apart from the end 17c.

In order to connect the driving IC 17 with the first substrate 10 structured in this manner, as shown in FIGS. 7B, 8A and 8B, after an anisotropic conductive film 12 is disposed in the mounting area 10f of the first substrate 10, the driving IC 17 is overlapped therewith. Then, the overlapped portion is cooled after heated in the state. As a result, the driving IC 17 is fixed to the mounting area 10f of the first substrate 10 by a resin matrix 12a of the anisotropic conductive film 12. Further, by electro conductive particles 12b that are dispersed in the resin matrix 12a of the anisotropic conductive film 12, the substrate-side first terminal 136 and the component-first terminal 176 are electrically connected, and the substrate-side second terminal 137 and the component-side second terminal 177 are electrically connected.

In the electro optical device 100 constituted in this manner, the first substrate 10 and the driving IC 17 constitute a mounting structure. In the mounting structure, the plurality of substrate-side first terminals 136 and the plurality of substrate-side second terminals 137 that are aligned in the Second direction are arranged in two rows in the First direction. Further, the substrate-side first terminals 136 and the substrate-side second terminals 137 are formed at positions deviated in the Second direction. Also in the driving IC 17, the plurality of component-side first terminals 176 and the component-side second terminals 177 are arranged in two rows in the First direction and the component-side first terminals 176 and the component-side second terminals 177 are formed at positions deviated in the Second direction so as to correspond to the arrangement of the substrate-side first terminals 136 and the substrate-side second terminals 137.

Further, the width size Wa1 of the substrate-side first terminal 136, the width size Wa2 of the substrate-side second terminal 137, the width size Wf1 of component-side first terminal 176, the size Wf2 of the component-side second terminal 177 in the Second direction satisfy the following relations:

Wa1<Wa2

Wf1>Wf2

Wa1<Wf1

Wa2>Wf2.

The width size Wa1 of the substrate-side first terminal 136 is narrower than the width size Wa2 of the substrate-side second terminal 137. Accordingly, the substrate-side second wiring pattern 147 can be easily passed through between the substrate-side first terminals 136, so that it is not necessary to form a needless step on the surface of the substrate-side first terminal 136. Accordingly, it is not necessary to purposely narrow the width sizes as for the substrate-side first terminal 136 and the substrate-side second wiring pattern 147 even when the number of the wiring pattern and the substrate-side terminal are increased without extending the mounting area 10f at the first substrate 10 side. Further, as for the substrate-side second terminals 137, there is no substrate-side first terminal 136 at the position adjacent in the Second direction. Accordingly, the substrate-side second terminals 137 can be formed to have an enough width size.

Further, the width size of the component-side first terminal 176 that is connected to the substrate-side first terminal 136 at the side of the driving IC 17 is increased as the width size of the substrate-side first terminal 136 is narrower than that of the substrate-side second terminal 137. On the other hand, the width size of the component-side second terminal 177 that is connected to the substrate-side second terminal 137 at the side of the driving IC 17 is decreased as the width size of the substrate-side second terminal 137 is wider than that of the substrate-side first terminal 136. Consequently, the substrate-side first terminal 136 surely overlaps with the component-side first terminal 176, and the substrate-side second terminal 137 surely overlaps with the component-side second terminal 177, so that electrical connection is assured. In addition, the overlapped area of the substrate-side first terminal 136 and the component-side first terminal 176 and the overlapped area of the substrate-side second terminal 137 and the component-side second terminal 177 are equivalent. Consequently, the connection resistance of each connection part is equivalent even when the positional relationship between the first substrate 10 and the driving IC 17 are deviated in the Second direction.

In addition, even when the positional relationship between the first substrate 10 and the driving IC 17 is deviated in the Second direction, the substrate-side first terminal 136 surely overlaps with the component-side first terminal 176 and the substrate-side second terminal 137 surely overlaps with the component-side second terminal 177, so that electrical connection is assured. In addition, the overlapped area of the substrate-side first terminal 136 and the component-side first terminal 176 and the overlapped area of the substrate-side second terminal 137 and the component-side second terminal 177 are equivalent. Accordingly, even when the positional relationship between the first substrate 10 and the driving IC 17 is deviated in the Second direction, the connection resistance of each connection part is equivalent.

In addition, the substrate-side second wirings 147 are linearly extended to have a same width size in the First direction in the mounting area 10f, and the width size Wd2 of the part that is linearly extended and the width size Wa2 of the substrate-side second terminal 137 satisfy the following relation:

Wd2<Wa2.

That is, as for the substrate-side second terminals 137, there is a special allowance in the Second direction. Accordingly, as for the substrate-side second terminals 132, the width size can be increased than that of the substrate-side second wirings 147. Accordingly, reliability of an electrical connecting part with the driving IC 17 can be improved.

Further, the substrate-side first wirings 146 are linearly extended to have a same width size in the First direction near the mounting area 10f, and the width size Wd1 of the part that is linearly extended and the width size Wa1 of the substrate-side first terminal 136 satisfy the following relation:

Wa1=Wd1.

That is, as for the substrate-side first terminals 136, there is no special allowance in the Second direction. However, the width size of the substrate-side first terminal 136 is formed so as to be equivalent to the substrate-side first wiring pattern 146, and the width size is increased to the utmost limit. Accordingly, the reliability of the electrically connection part with the driving IC can be improved.

Furthermore, the width size Wd1 of the substrate first wiring pattern 146 near the mounting area 10f, and the width size Wd2 of the substrate-side second wiring pattern 147 in the mounting area 10f satisfy the following relation:

Wd1=Wd2.

That is, the width size of the substrate-side first wiring pattern 146 and the width size of the substrate-side second wiring pattern 147 are same. Consequently, the resistance value in each signal transmission pathway via the substrate-side wiring pattern 146 and the substrate-side second wiring pattern 147 on the first substrate 10 is equivalent.

Third Embodiment

Hereinafter, an example in which the invention is applied to an organic EL device will be described. In the following description, the same reference numeral is used for the corresponding element as the first and the second embodiments as much as possible for the sake of easy recognition.

Figure 9:
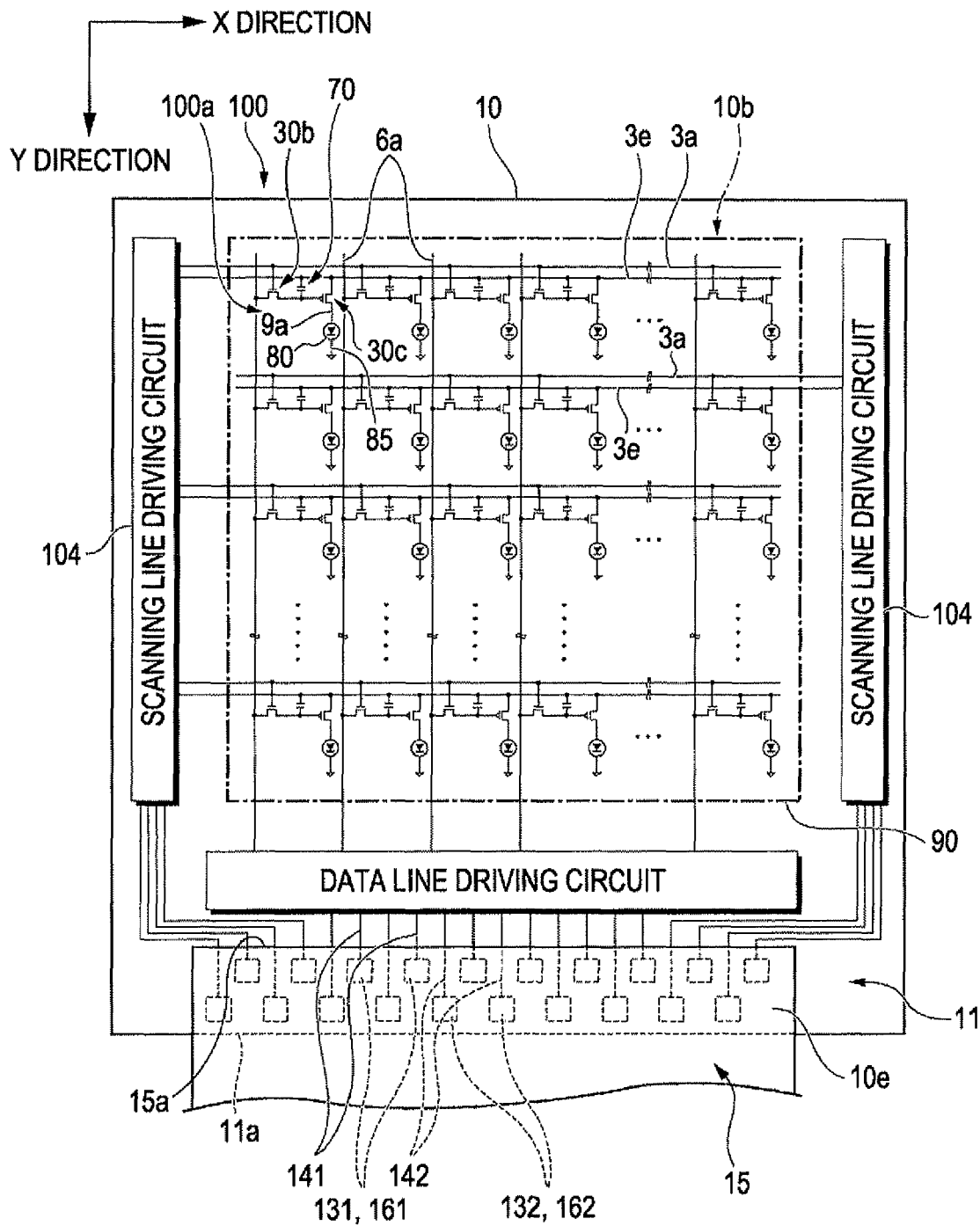
FIG. 9 is a block diagram showing an electrical structure of an electro optical device (organic EL device) according to a third embodiment of the invention.
Figure 10A:
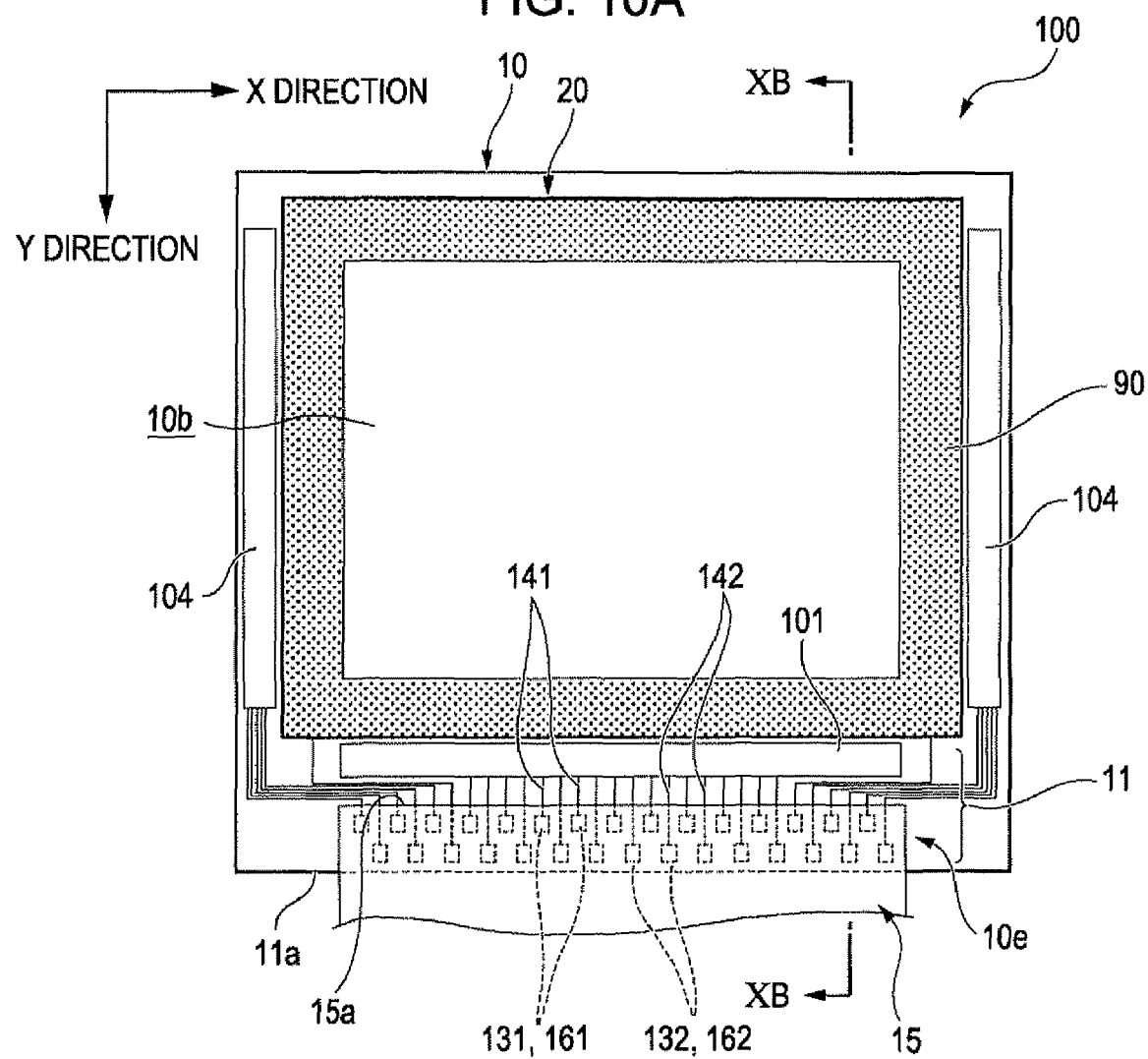
FIG. 10A is a plan view showing the electro optical device according to the third embodiment of the invention viewed from a side of a counter substrate with each constituent element formed thereon.
Figure 10B:
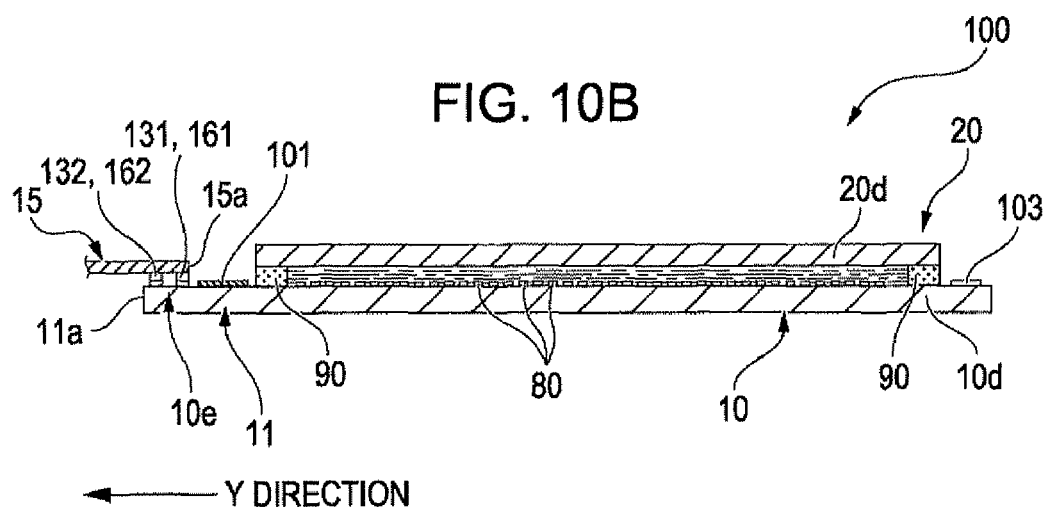
FIG. 10B is a cross sectional view thereof taken along the line XB-XB of FIG. 10A.

FIG. 9 is a block diagram showing an electrical structure of an electro optical device (organic EL device) according to a third embodiment. FIG. 10A is a plan view showing the electro optical device according to the third embodiment of the invention viewed from a side of a counter substrate with each constituent element formed thereon, and FIG. 10B is a cross sectional view thereof taken along the line XB-XB of FIG. 10A.

The electro optical device 100 shown in FIG. 9 is an organic EL device and is equipped with a plurality of scanning lines 3a, a plurality of data lines 6a extending in the direction perpendicular to the scanning lines 3a, and a plurality of power lines 3e extending in parallel with the scanning lines 3a on the first substrate 10. Further, on the first substrate 10, a plurality of pixels 100a are arranged in a matrix manner in a pixel area 10b having a rectangular shape. The data lines 6a are connected to a data line driving circuit 101, and the scanning lines 3a are connected to the scanning line driving circuits 104. Each of the pixels 10a is constituted by a thin film transistor 30b for switching for which a scanning signal is supplied to the gate electrode via the scanning line 3a, a holding capacitor 70 that holds a pixel signal supplied form the data line 6a via the thin film transistor 30b for switching, a thin film transistor 30c for driving for which the pixel signal held by the holding capacitor 70 is supplied to the gate electrode, a pixel electrode 9a (positive pole layer) into which a driving current is flown from the power line 3e when electrically connected with the power line 3e via the thin film transistor 30c, and an organic EL element 80 in which an organic function layer is sandwiched between the pixel electrode 9a and a negative pole layer.

According to the structure, when the scanning line 3a is driven and the thin film transistor 30b for switching is turned on, the electrical potential of the data line 6a at the time is held by the holding capacitor 70, and an ON/Off state of the thin film transistor 30c for driving is determined in accordance with the electrical charge held by the holding capacitor 70. Then, a current is flown into the pixel electrode 9a from the power line 3e via a channel of the thin film transistor 30c for driving, and a current is flown to a pole layer via the organic function layer. As a result, the organic EL element 80 emits light in accordance with a current amount flown therein.

In the structure shown in FIG. 9, the power line 3e is arranged in parallel with the scanning line 3a. However, the power line 3e may be arranged in parallel with the data line 6a. Further, in the structure shown in FIG. 9, the holding capacitor 70 is constituted by using the power line 3e. However, a capacitor line may be constituted separately from the power line 3e to constitute the holding capacitor 70 with the capacitor line.

In FIGS. 10A, 10B, in the electro optical device 100 according to the embodiment, the first substrate 10 as an element substrate and the second substrate 20 as a sealing substrate are bonded together with the sealing part 90, and nitrogen atmosphere or a filling material is held between the first substrate 10 and the second substrate 20. In the first substrate 10, in the area outside the sealing part 90, the data line driving circuit 101 and the scanning line driving circuits 104 are formed, and the flexible printed circuit 15 is connected to the projected area 11 of the first substrate 10. Further, in the first substrate 10, the organic EL elements 80 in each of which the pixel electrode (positive pole), the organic function layer, and the negative pole are laminated in this order are formed in a matrix manner.

In the electro optical device 100 structured in this manner, when the flexible printed circuit 15 is connected to the first substrate 10, the structure similar to the first embodiment may be employed. Further, as is omitted in the drawings, when the driving IC is mounted in the projected area 11 of the first substrate 10, the structure described in the second embodiment may be employed.

Other Embodiment

In the aforementioned embodiments, the substrate-side first terminals 131, 136 and the substrate-side second terminals 132, 137 are formed by a conductive film separate from the substrate-side first wirings 141, 146 and the substrate-side second wirings 142, 147, and the substrate-side first wirings 141, 146 and the substrate-side second wirings 142, 147 are covered with the insulating film 7. However, the invention can be applied to the case in which the substrate-side first terminals 131, 136 and the substrate-side second terminals 132, 137 are formed by a part of the substrate-side first wirings 141, 146 and the substrate-side second wirings 142, 147.

Mounting Example on Electronic Apparatus

Next, with reference to FIGS. 11A to 11D, electronic apparatuses to which the electro optical device 100 according to the aforementioned first to third embodiments is applied will be described. FIGS. 11A to 11D are each an explanatory diagram showing an electronic apparatus in which the electro optical device according to the invention is used.

Figure 11A:
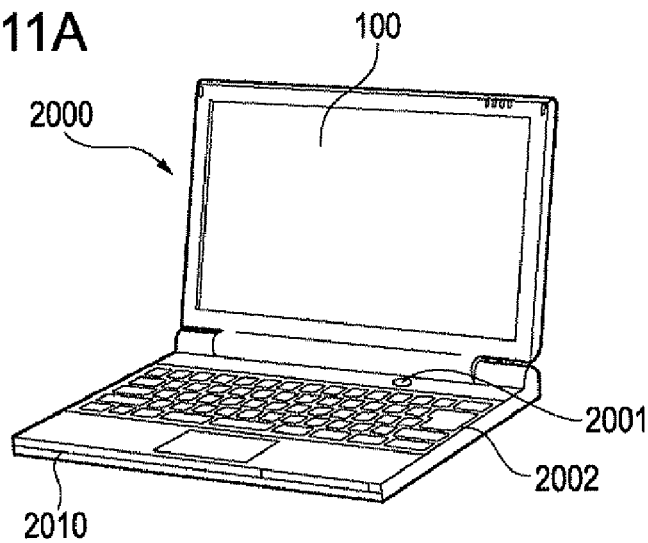
FIGS. 11A to 11D are each an explanatory diagram showing an electronic apparatus in which the electro optical device according to the invention is used.
Figure 11B:
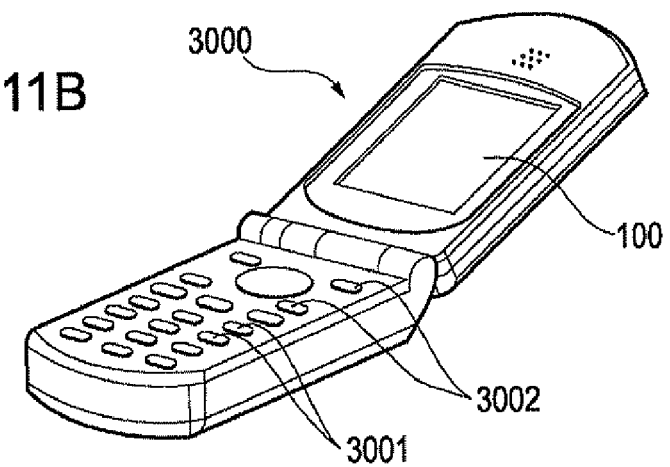
Figure 11C:
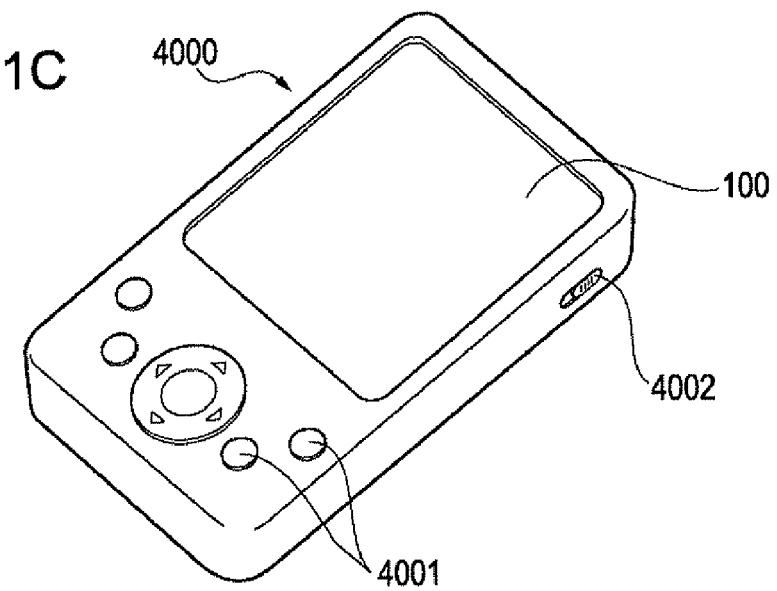
Figure 11D:
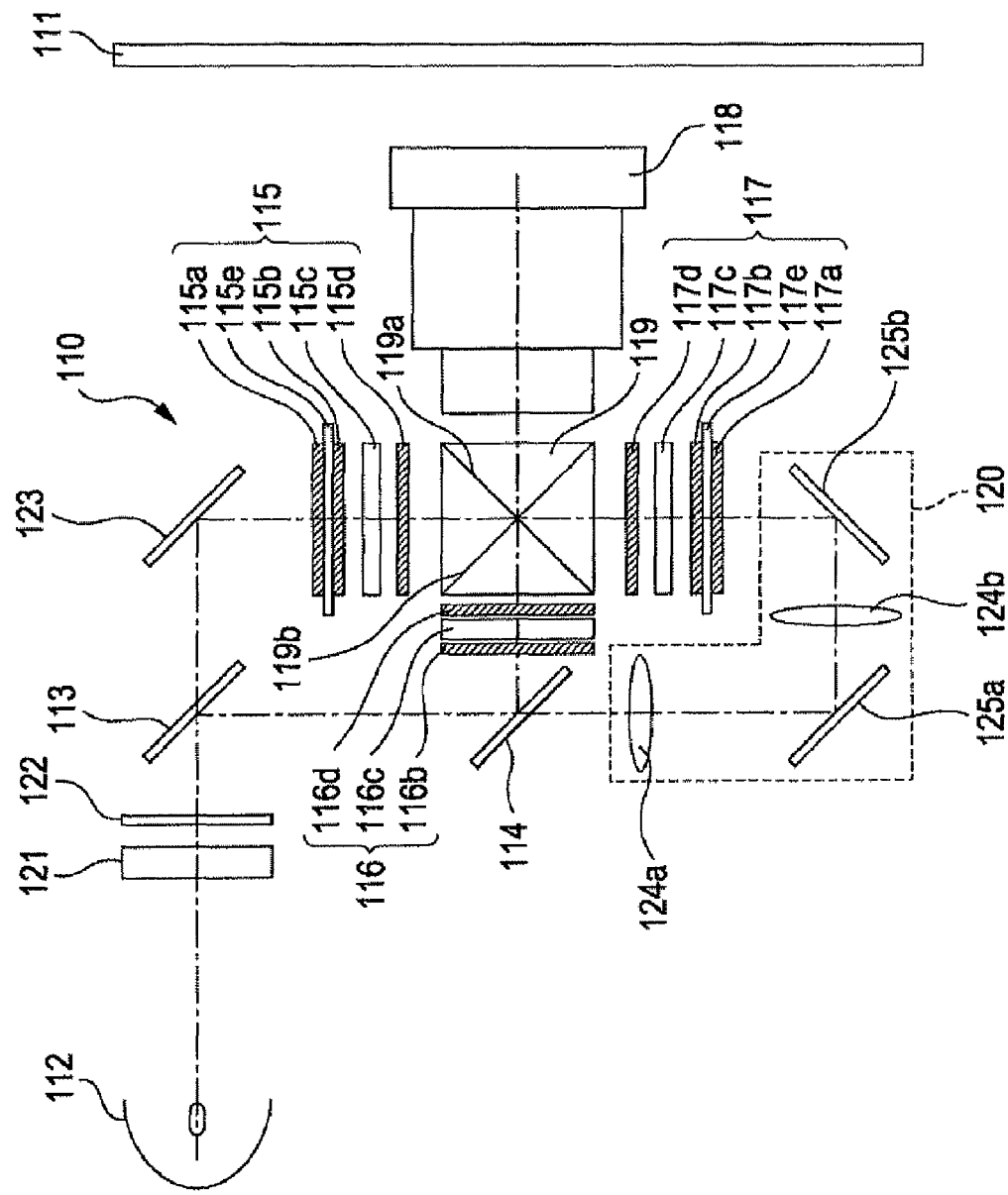
Figure 12A:
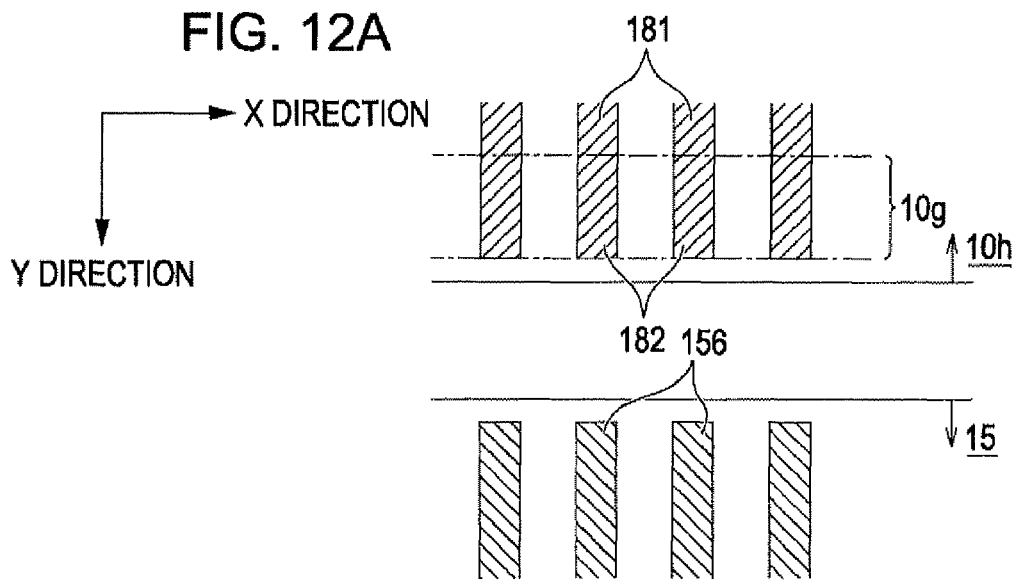
FIGS. 12A to 12C are each an explanatory diagram showing terminals and wirings according to a comparative example of the invention.
Figure 12B:
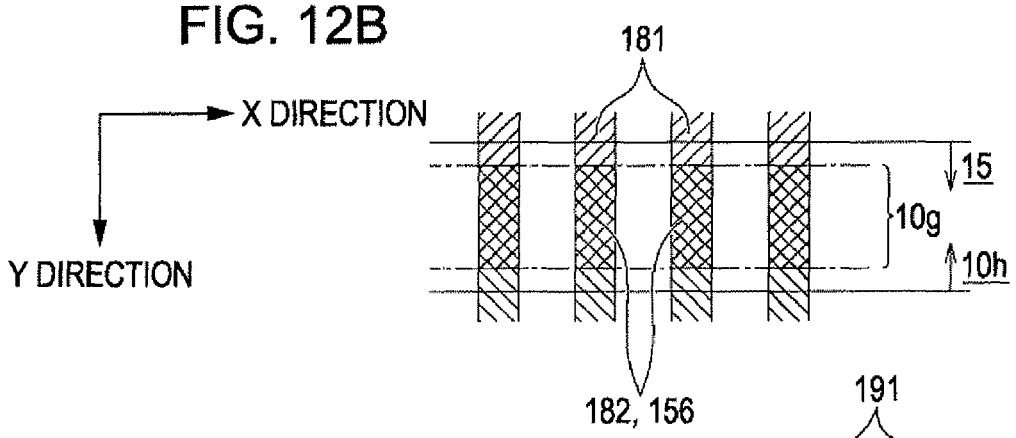
Figure 12C:
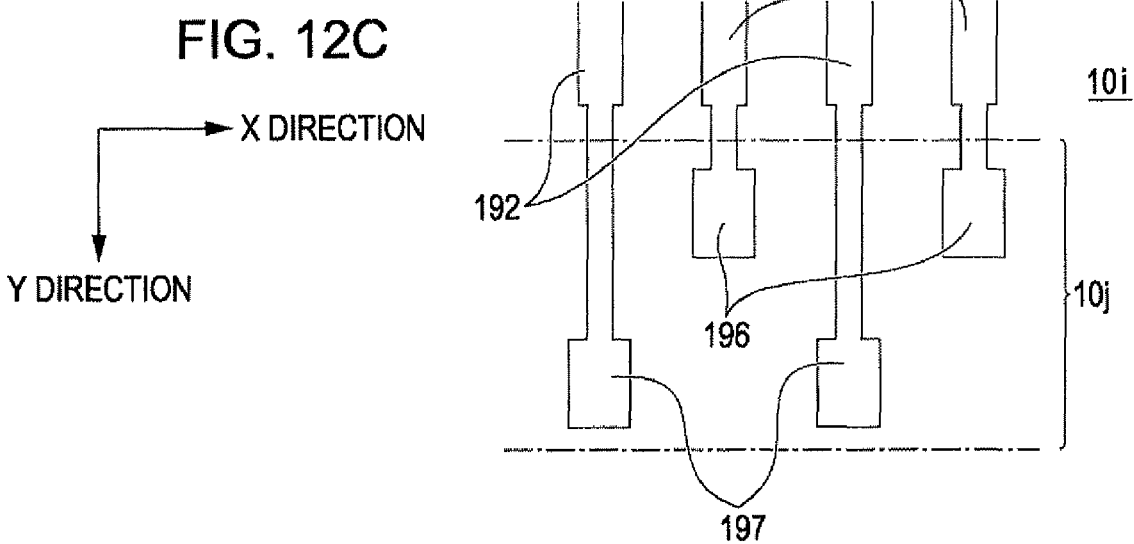

A structure of a mobile personal computer equipped with the electro optical device 100 is shown in FIG. 11A. The personal computer 2000 is equipped with the electro optical device 100 as a display unit and a main body unit 2010. A power switch 2001 and a key board 2002 are provided in the main body unit 2010. A structure of a mobile phone equipped with the electro optical device 100 is shown in FIG. 11B. The mobile phone 3000 is equipped with a plurality of operational buttons 3001, scroll buttons 3002, and the electro optical device 100 as a display unit. By operating the scroll buttons 3002, a screen displayed on the electro optical device 100 is scrolled. A structure of a PDA (Personal Digital Assistants) to which the electro optical device 100 is applied is shown in FIG. 11C. The PDA 4000 is equipped with a plurality of operational buttons 4001, a power switch 4002, and the electro optical device 100 as a display unit. When the power switch 4002 is operated, various information such as an address book, a schedule book, or the like is displayed on the electro optical device 100. Note that, as for an electronic apparatus to which the electro optical device 100 is applied, besides the electronic apparatuses shown in FIGS. 11A to 11C, there are included a digital still camera, a liquid crystal television, a viewfinder type or monitor direct-viewing type videotape recorder, a vehicle navigation device, a pager, an electronic diary, a calculator, a word processor, a workstation, a television phone, a POS terminal, apparatuses equipped with touch panels, and the like. Then, as a display unit of each of the various electronic apparatuses, the aforementioned electro optical device 100 can be applied Next, an example in which the electro optical device 100 (liquid crystal device) according to the first and the second embodiments of the invention is employed in a liquid crystal light valve of a projector (projection display device) will be described with reference to FIG. 11D. FIG. 11D is a configuration diagram schematically showing a projector. The projector 110 is a so-called projective projector in which a screen 111 disposed on a viewer side is irradiated with light and the light reflected by this screen 111 is viewed. The projector 110 includes a light source 112, a dichroic mirrors 113 and 114, liquid crystal light valves 115 to 117 (electro optical device 100), a projection optical system 118, a cross dichroic prism 119, and a relay system 120.

The light source 112 is constituted by an ultra-high pressure mercury lamp for supplying light containing red, green, and blue light components. The dichroic mirror 113 transmits red light and reflects green and blue light from the light source 112. The dichroic mirror 114 transmits the blue light and reflects the green light of the green and blue light reflected by the dichroic mirror 113. Thus, the dichroic mirrors 113 and 114 constitute a color-separation optical system for separating the light emitted from the light source 112 into red light, green light, and blue light. Here, an integrator 121 and a polarization conversion element 122 are disposed between the light source 112 and the dichroic mirror 113 in this order from the light source 112 side. The integrator 121 equalizes the illumination distribution of light emitted from the light source 112. The polarization conversion element 122 converts light from the light source 112 into polarized light with a specific vibration direction, such as s-polarized light.

The liquid crystal light valve 115 is a transmissive liquid crystal device (electro optical device) for modulating the red light passed through the dichroic mirror 113 and reflected by a reflection mirror 123 according to an image signal. The liquid crystal light valve 115 includes a λ/2 retardation film 115a, a first polarizer 115b, a liquid crystal panel 115c, and a second polarizer 115d. Here, though the red light that enters the liquid crystal light valve 115 passes through the dichroic mirror 113, the polarization of the red light is not changed. Therefore, the s-polarization state is maintained. The λ/2 retardation film 115a is an optical element for converting the s-polarized light that entered the liquid crystal light valve 115 into p-polarized light. The first polarizer 115b is a polarizer that interrupts s-polarized light and transmits p-polarized light. The liquid crystal panel 115c converts the p-polarized light into s-polarized light (in a grayscale, circularly or elliptically polarized light) by modulation according to an image signal. Furthermore, the second polarizer 115d is a polarizer that interrupts p-polarized light and transmits s-polarized light. Consequently, the liquid crystal light valve 115 has a structure for modulating red light according to an image signal and emitting the modulated red light toward the cross dichroic prism 119. Furthermore, a transparent glass plate 115e not converting polarization is disposed between the λ/2 retardation film 115a and the first polarizer 115b so as to be in contact therewith, and thereby the λ/2 retardation film 115a and the first polarizer 115b are prevented from being deformed by heat.

The liquid crystal light valve 116 is a transmission liquid crystal device for modulating the green light reflected by the dichroic mirror 113 and then by the dichroic mirror 114, according to an image signal. The liquid crystal light valve 116, similarly to the liquid crystal light valve 115, includes a first polarizer 116b, a liquid crystal panel 116c, and a second polarizer 116d. The green light that enters the liquid crystal light valve 116 is s-polarized light reflected by the dichroic mirrors 113 and 114. The first polarizer 116b is a polarizer that interrupts p-polarized light and transmits s-polarized light. The liquid crystal panel 116c converts the s-polarized light into p-polarized light (in a grayscale, circularly or elliptically polarized light) by modulation according to an image signal. Furthermore, the second polarizer 116d is a polarizer that interrupts s-polarized light and transmits p-polarized light. Consequently, the liquid crystal light valve 116 has a structure for modulating green light according to an image signal and emitting the modulated green light toward the cross dichroic prism 119.

The liquid crystal light valve 117 is a transmissive liquid crystal device for modulating the blue light reflected by the dichroic mirror 113 and transmitted through the dichroic mirror 114 and then passed through the relay system 120, according to an image signal. The liquid crystal light valve 117, similarly to the liquid crystal light valves 115 and 116, includes a λ/2 retardation film 117a, a first polarizer 117b, a liquid crystal panel 117c, and a second polarizer 117d. Here, the blue light that enters the liquid crystal light valve 117 is reflected by the dichroic mirror 113, transmitted through the dichroic mirror 114, and then reflected by two reflection mirrors 125a and 125b, which are described below, of the relay system 120, and thereby is s-polarized light. The λ/2 retardation film 117a is an optical element for converting the s-polarized light that entered the liquid crystal light valve 117 into p-polarized light. The first polarizer 117b is a polarizer that interrupts s-polarized light and transmits p-polarized light. The liquid crystal panel 117c converts the p-polarized light into s-polarized light (in a grayscale, circularly or elliptically polarized light) by modulation according to an image signal. Furthermore, the second polarizer 117d is a polarizer that interrupts p-polarized light and transmits s-polarized light. Consequently, the liquid crystal light valve 117 has a structure for modifying blue light according to an image signal and emitting the modulated blue light toward the cross dichroic prism 119. A glass plate 117e is disposed between the λ/2 retardation film 117a and the first polarizer 117b so as to be in contact therewith.

The relay system 120 includes relay lenses 124a and 124b and the reflection mirrors 125a and 125b. The relay lenses 124a and 124b are provided for preventing a loss in light intensity of the blue light whose light-path is long. The relay lens 124a is disposed between the dichroic mirror 114 and the reflection mirror 125a. The relay lens 124b is disposed between the reflection mirrors 125a and 125b. The reflection mirror 125a is disposed so as to reflect the blue light transmitted through the dichroic mirror 114 and emitted from the relay lens 124a toward the relay lens 124b. The reflection mirror 125b is disposed so as to reflect the blue light emitted from the relay lens 124b toward the liquid crystal light valve 117. The cross dichroic prism 119 is a color synthesis optical system including two dichroic films 119a and 119b that are arranged to cross orthogonal to each other in an X-letter shape. The dichroic film 119a is a film that reflects blue light and transmits green light. The dichroic film 119b is a film that reflects red light and transmits green light. Accordingly, the cross dichroic prism 119 is constituted to compose the red light, green light, and blue light modulated by the liquid crystal light valves 115 to 117, respectively, and emit the composed light toward the projection optical system 118.

The light that enters the cross dichroic prism 119 from the liquid crystal light valves 115 and 117 is s-polarized light. The light that enters the cross dichroic prism 119 from the liquid crystal light valve 116 is p-polarized light. Thus, since the light that enters the cross dichroic prism 119 has different types of polarization, the incident light from the liquid crystal light valves 115 to 117 can be effectively composed in the cross dichroic prism 119. In general, the dichroic films 119a and 119b are excellent in reflection properties for s-polarized light. Accordingly, red light and blue light that are reflected by the dichroic films 119a and 119b are converted so as to enter the cross dichroic prism 119 in an s-polarization state, and green light that is transmitted through the dichroic films 119a and 119b is converted so as to enter the cross dichroic prism 119 in a p-polarization state. The projection optical system 118 includes a projection lens (not shown) and is constituted so as to project the light composed in the cross dichroic prism 119 on the screen 111.

What is claimed is:

1. A mounting structure comprising:
   a substrate;
   a component mounted on the substrate;
   substrate-side first wirings disposed over the substrate, the substrate-side first wirings extending in a first direction;
   substrate-side first terminals disposed over the substrate in a mounting area where the component is mounted on the substrate, the substrate-side first terminals being connected to corresponding substrate-side first wirings;
   substrate-side second wirings disposed on the substrate, the substrate-side second wirings extending in the first direction, and the substrate-side second wirings passing between corresponding adjacent two substrate-side first wirings and between corresponding adjacent two substrate-side first terminals;
   substrate-side second terminals disposed over the substrate in the mounting area, the substrate-side second terminals being connected to corresponding substrate-side second wirings;
   component-side first terminals provided to the component, one of the component-side first terminals overlapping with the corresponding substrate-side first terminal in plan view and being connected electrically with the corresponding substrate-side first terminal; and
   component-side second terminals provided to the component, one of the component-side second terminals overlapping with a corresponding substrate-side second terminal in plan view and being connected electrically with the corresponding substrate-side second terminal,
   wherein widths Wa1, Wa2, Wf1 and Wf2 satisfy all of the following relationships:

$Wa1 < Wa2$ $Wf1 > Wf2$ $Wa1 < Wf1$ $Wa2 > Wf2$;

wherein
      the width Wa1 is a dimension of the substrate-side first terminal in a second direction perpendicular to the first direction,
      the width Wa2 is a dimension of the substrate-side second terminal in the second direction,
      the width Wf1 is a dimension of the component-side first terminal in the second direction, and
      the width Wf2 is a dimension of the component-side second terminal in the second direction, and
   each of the substrate-side first wirings does not pass between corresponding adjacent two substrate-side second terminals.

2. The mounting structure according to claim 1, wherein the substrate-side second wirings linearly extend in the first direction to have a same width Wd2 in the mounting area; and
   widths Wa2 and Wd2 satisfy the following relationship:

$Wd2 < Wa2$.

3. The mounting structure according to claim 1, wherein the substrate-side first wirings linearly extend in the first direction to have a same width Wd1 near the mounting area; and
   widths Wa1 and Wd1 satisfy the following relationship:

$Wa1 = Wd1$.

4. The mounting structure according to claim 1, wherein
the substrate-side first wirings linearly extend in the first direction to have a same width Wd1 near the mounting area,
the substrate-side second wirings linearly extend in the first direction to have a same width Wd2 in the mounting area, and
the widths Wd1 and Wd2 satisfy the following relationship:

Wd1=Wd2.

5. The mounting structure according to claim 1, wherein
one of the component-side first terminals is electrically connected to corresponding substrate-side first terminal with an anisotropic conductive film that is provided between the substrate and the component in the mounting area, and
one of the component-side second terminals is electrically connected to corresponding substrate-side second terminal with the anisotropic conductive film.

6. The mounting structure according to claim 1, wherein the mounting area except for regions where the substrate-side first terminals and the substrate-side second terminals are provided is covered with an insulating layer.

7. The mounting structure according to claim 1, wherein the component is a flexible printed circuit.

8. The mounting structure according to claim 1, wherein the component is an IC.

9. An electro optical device comprising:
a first substrate;
a component mounted on the first substrate; and
a pixel including a pixel electrode, the pixel electrode being disposed over the first substrate;
substrate-side first wirings disposed over the first substrate, the substrate-side first wirings extending in a first direction;
substrate-side first terminals disposed over the first substrate in a mounting area where the component is mounted on the first substrate, the substrate-side first terminals being connected to corresponding substrate-side first wirings;
substrate-side second wirings disposed on the first substrate, the substrate-side second wirings extending in the first direction, and substrate-side second wirings passing between corresponding adjacent two substrate-side first wirings and between corresponding adjacent two substrate-side first terminals;
substrate-side second terminals disposed over the first substrate in the mounting area, the substrate-side second terminals being connected to corresponding substrate-side second wirings;
component-side first terminals provided to the component, one of the component-side first terminals overlapping with the corresponding substrate-side first terminal in plan view and being connected electrically with the corresponding substrate-side first terminal; and
component-side second terminals provided to the component, one of the component-side second terminals overlapping with a corresponding substrate-side second terminal in plan view and being connected electrically with the corresponding substrate-side second terminal,
wherein widths Wa1, Wa2, Wf1 and Wf2 satisfy all of the following relationships:

Wa1<Wa2

Wf1>Wf2

Wa1<Wf1

Wa2>Wf2;

wherein
the width Wa1 is a dimension of the substrate-side first terminal in a second direction perpendicular to the first direction,
the width Wa2 is a dimension of the substrate-side second terminal in the second direction,
the width Wf1 is a dimension of the component-side first terminal in the second direction, and
the width Wf2 is a dimension of the component-side second terminal in the second direction, and
each of the substrate-side first wirings does not pass between corresponding adjacent two substrate-side second terminals.

10. The electro optical device according to claim 9, wherein a liquid crystal layer is held between the first substrate and a second substrate, the second substrate being disposed opposite to the first substrate.

11. The electro optical device according to claim 9, wherein an electro-luminescence element is disposed over the first substrate.

* * * * *